United States Patent
Brust et al.

(10) Patent No.: US 10,059,821 B2
(45) Date of Patent: *Aug. 28, 2018

(54) METHOD OF PREPARING ARTICLE WITH POLYANILINE COATING

(71) Applicant: Eastman Kodak Company, Rochester, NY (US)

(72) Inventors: Thomas B. Brust, Webster, NY (US); Anne Troxell Wyand, Victor, NY (US); Grace Ann Bennett, Scottsville, NY (US); Catherine A. Falkner, Rochester, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 162 days.

This patent is subject to a terminal disclaimer.

(21) Appl. No.: 15/133,295

(22) Filed: Apr. 20, 2016

(65) Prior Publication Data

US 2017/0306121 A1    Oct. 26, 2017

(51) Int. Cl.
| | |
|---|---|
| H01L 21/027 | (2006.01) |
| C08J 7/16 | (2006.01) |
| H01B 1/12 | (2006.01) |
| C08F 212/14 | (2006.01) |
| C08J 7/04 | (2006.01) |
| C08J 7/12 | (2006.01) |
| C08G 73/02 | (2006.01) |
| B05D 7/04 | (2006.01) |
| B05D 3/06 | (2006.01) |
| B05D 7/00 | (2006.01) |
| H05K 3/02 | (2006.01) |
| H05K 3/10 | (2006.01) |
| B05D 3/10 | (2006.01) |
| G03F 7/004 | (2006.01) |
| G03F 7/40 | (2006.01) |

(52) U.S. Cl.
CPC .............. C08J 7/16 (2013.01); B05D 3/067 (2013.01); B05D 3/101 (2013.01); B05D 7/04 (2013.01); B05D 7/544 (2013.01); B05D 7/584 (2013.01); C08F 212/14 (2013.01); C08G 73/0266 (2013.01); C08J 7/047 (2013.01); C08J 7/123 (2013.01); G03F 7/004 (2013.01); G03F 7/40 (2013.01); H01B 1/128 (2013.01); H05K 3/02 (2013.01); H05K 3/105 (2013.01); *C08J 2367/02* (2013.01); *C08J 2425/08* (2013.01)

(58) Field of Classification Search
CPC ..... B05D 3/067; G03F 7/004; H01L 21/0231; H01L 21/02318
USPC ....................................................... 430/325
See application file for complete search history.

(56) References Cited

U.S. PATENT DOCUMENTS

| | | | |
|---|---|---|---|
| 6,045,977 A | 4/2000 | Chandross et al. | |
| 8,703,458 B2 | 4/2014 | Heller et al. | |
| 8,932,494 B2 | 1/2015 | Liao et al. | |
| 9,644,112 B1 * | 5/2017 | Brust | .................. C09D 179/02 |
| 9,718,935 B1 * | 8/2017 | Brust | .......................... C08J 7/16 |

OTHER PUBLICATIONS

Gordana Ćirić-Marjanović, "Recent advances in polyaniline research: Polymerization mechanisms, structural aspects, properties and applications," *Synthetic Metals* 177 (2013) 1-47.
Gordana Ćirić-Marjanović, "Recent advances in polyaniline composites with metals, metalloids and nonmetals," *Synthetic Metals* 170 (2013) 31-56.
J.H. Hwang and S.C. Yang, "Morphological Modification of Polyaniline Using Polyelectrolyte Template Molecules," *Synthetic Metals*, 29 (1989) E271-E276.
Yongku Kang et al., "Electrochemical properties of polyaniline doped with poly(styrenesulfonic acid)," *Synthetic Metals*, 52 (1992) 319-328.
Niyazi Bicak et al., "Polymerization of Aniline by Copper-Catalyzed Air Oxidation," *Journal of Polymer Science: Part A: Polymer Chemistry*, vol. 44, 6025-6031 (2006).
Zhi Chen et al., "A green route to conducting polyaniline by copper catalysis," *Journal of Catalysis* 267 (2009) 93-96.
Barts Kumru et al., "Polymerization of Aniline in Microemulsion by Catalytic Air Oxidation," *Macromol. Symp.* 2015, 352, 42-45.
L.Y. Ji et al., "Oxidative Graft Polymerization of Aniline on PTFE Films Modified by Surface Hydroxylation and Silanization," *Langmuir* 2002, 18, 9035-9040.
Olga D. Iakobson et al., "Conductive composites of polyaniline-polyacid complex and graphene nanostacks," *Synthetic Metals* 211 (2016) 89-98.
Wenbin Zhong et al., "Oxidative Graft Polymerization of Aniline on the Modified Surface of Polypropylene Films," *Journal of Applied Polymer Science*, vol. 103, 2442-2450 (2007).
Jyongsik Jang et al., "Organic light-emitting diode with polyaniline-poly(styrene sulfonate) as a hole injection layer," *ScienceDirect*, Thin Solid Films 516 (2008) 3152-3156.

(Continued)

*Primary Examiner* — Daborah Chacko Davis
(74) *Attorney, Agent, or Firm* — J. Lanny Tucker

(57) ABSTRACT

A method is used to provide an electrically-conductive polyaniline pattern by providing a uniform layer of a photocurable composition on a substrate. The photocurable composition comprises a water-soluble reactive polymer comprising (a) greater than 40 mol % of recurring units comprising sulfonic acid or sulfonate groups, and (b) at least 5 mol % of recurring units comprising a pendant group capable of crosslinking via [2+2] photocycloaddition. The photocurable composition is exposed to cause crosslinking via [2+2] photocycloaddition of the (b) recurring units, thereby forming a crosslinked polymer. Any remaining water-soluble reactive polymer is removed. The crosslinked polymer is contacted with an aniline reactive composition having aniline monomer and up to 0.5 molar of an aniline oxidizing agent, thereby forming an electrically-conductive polyaniline disposed either within, on top of, or both within and on top of, the crosslinked polymer.

20 Claims, No Drawings

(56) References Cited

OTHER PUBLICATIONS

Hang Sun et al., "A self-standing nanocomposite foam of polyaniline@reduced graphene oxide for flexible super-capacitors," *Synthetic Metals* 209 (2015) 68-73.
Tiago Rosa et al., "Self-assembled films based on polyaniline/multiwalled carbon nanotubes composites and sulphonated polystyrene deposited onto ITO substrates," *Synthetic Metals* 210 (2015) 186-191.

* cited by examiner

METHOD OF PREPARING ARTICLE WITH POLYANILINE COATING

RELATED APPLICATIONS

Copending and commonly assigned U.S. Ser. No. 15/133,336, filed on Apr. 20, 2016. by Brust, Wyand, Bennett, and Falkner, and entitled "Method of Preparing Article with Polyaniline Pattern" and Copending and commonly assigned U.S. Ser. No. 15/133,583, filed on Apr. 20, 2016, by Brust, Wyand, Bennett, and Falkner, and entitled "Articles Having Electrically-conductive Layer or Pattern."

FIELD OF THE INVENTION

This invention relates to a method for providing uniform layers or patterns of electrically-conductive polyaniline disposed within, on top of, or both within and on top of, crosslinked polymers that are derived from water-soluble reactive polymers comprising pendant sulfonic acid or sulfonate groups and pendant groups that are crosslinkable through [2+2] photocycloaddition. The articles provided by such methods can have layers or patterns of the electrically-conductive polyaniline on one or both supporting sides of a substrate.

BACKGROUND OF THE INVENTION

Polyaniline (PANI) is the polymer formed by chemical or electrochemical oxidative polymerization of aniline. Polyaniline can vary in its degree of oxidation and protonation depending upon the conditions of the polymerization and the presence of a source of acidic protons. In its partially oxidized and protonated form called emeraldine salt, it is electrically-conductive and thus has attracted great attention for several decades to determine the basic physics of its electrical conductivity and to realize its potential in numerous applications ranging from chemical and bio-sensors, electrochromic windows, light emitting diodes, batteries, supercapacitors, photovoltaics, anti-corrosion coatings, and even artificial muscles. Recent literature highlight the unique physical character of coatings employing polyaniline and its various composites with graphene, carbon nanotubes, and a wide variety of nano-particles and nano-structures.

A film of polyaniline can be readily formed by oxidation at an anode surface during electropolymerization. This polymerization process has the limitation of requiring a conductive substrate and would likely be difficult for flexible roll-to-roll coating and manufacturing operations. Typical chemical oxidative polymerization of polyaniline produces a powder that is insoluble in water and sparingly soluble in solvents such as N-methyl pyrrolidone if crosslinking through the aniline monomer ortho-position is limited in the polymerization process. To be electrically-conductive, this PANI powder must be not over-oxidized and must be partially protonated or doped with a strong acid such as hydrochloric acid or a sulfonic acid such as p-toluene sulfonic acid or camphor sulfonic acid that will not volatilize from within a thin coating. Such polymerization can also be carried out in the presence of an acidic polymer such as poly(styrene sulfonic acid) that forms a polymer complex providing aqueous solubility and a permanent acidic dopant for conductivity similar to the conductive polymer composite of poly(3,4-ethylenedioxythiophene)(PEDOT) and poly (styrene sulfonic acid)(PSS) typically referred to in the art as PEDOT:PSS. These composites of PSS and PANI can then be coated from water, but a method to pattern and insolubilize the coating is still required to make it compatible with and durable in further processing steps that may be required to form an article having an electrically-conductive pattern.

Many uses of PANI require a patterning process to form electrodes, interconnects, or sensing patterns designed from the electrically-conductive polymer. Printing methods such as screen, flexographic, gravure, and inkjet are possible and have been discussed in the literature. Such PANI printed images will still be soluble in some solvents used during printing and may exhibit problems with durability or compatibility with other materials required for a making such devices. Patterning of polyaniline films has been carried out using traditional lithographic methods where a soluble polyaniline coating is masked by an imaging polymer and the unmasked PANI is dissolved. The masking polymer may then be removed if necessary if the underlying PANI is not soluble in the solvent for the mask polymer. Vacuum deposition and etching methods well known in the semiconductor industry could also be used to form coatings and patterns, but the process is expensive and does not lend itself to simple roll-to-roll coatings operations.

U.S. Pat. No. 6,045,977 (Chandross et al.) describes a method for making a device in which a conductive PANI salt layer is formed on a substrate and patterned into a desired configuration. U.S. Pat. No. 8,932,494 (Liao et al.) describes a method for forming electrically-conductive PANI-based composites by photo-irradiation a base form of PANI and a photo acid generator that is sensitive to the irradiation, converting the non-conducting base form of PANI to conductive PANI salt in a polymer composite.

While it is possible to form coatings of PANI from organic solvents or even from water if the PANI is complexed with a strongly acidic polymer like PSS, the patterning process can create substantial difficulty, expense, and complexity in building functional devices with electrically-conductive patterns. Furthermore, without some curing or crosslinking process, these electrically-conductive patterns will still be soluble in water or other solvents that may be used to build the device. For example, often polyaniline requires post treatment with acidic solutions or oxidizing or reducing agents to obtain the desired electrical conductivity. A simple method of forming a water-insoluble and durable coating or pattern of polyaniline that is permanently doped in its conductive emeraldine salt form without further processing could provide simplified and lower cost methods to form devices with patterns of polyaniline.

There remains a need for a simple method for producing electrically-conductive polyaniline in the form of uniform layers or patterns on various substrates including continuous flexible polymeric webs in roll-to-roll manufacturing operations, which electrically-conductive layers or patterns can be used to provide various devices including display touch screens.

SUMMARY OF THE INVENTION

The present invention provides a method for providing an electrically-conductive polyaniline pattern, the method comprising:

providing a uniform layer of a photocurable composition on a supporting side of a substrate, the photocurable composition comprising a water-soluble reactive polymer comprising (a) greater than 40 mol % of recurring units comprising sulfonic acid or sulfonate groups, (b) at least 5 mol % of recurring units comprising a pendant group capable of crosslinking via [2+2] photocycloaddition, and optionally (c) at least 1 mol % of recurring units comprising a pendant amide, hydroxyl, lactam, phosphonic acid, phosphonate, carboxylic acid, or carboxylate group, all amounts based on the total recurring units in the water-soluble reactive polymer;

exposing the photocurable composition to radiation sufficient to cause crosslinking via [2+2] photocycloaddition of the (b) recurring units, thereby forming a crosslinked polymer on the supporting side of the substrate;

removing any non-crosslinked water-soluble reactive polymer from the supporting side of the substrate;

optionally, contacting the crosslinked polymer with a metal ion catalyst for aniline oxidation, followed by rinsing the crosslinked polymer, and contacting the crosslinked polymer with an aniline reactive composition comprising an aniline monomer and up to 0.5 molar of an aniline oxidizing agent, in a molar ratio of from 1:0.5 to 1:1.5 of the aniline monomer to the aniline oxidizing agent, thereby forming an electrically-conductive polyaniline disposed either within, on top of, or both within and on top of, the crosslinked polymer.

Such method can further comprise:

exposing the uniform layer of the photocurable composition in an imagewise fashion, thereby forming a pattern of crosslinked regions comprising crosslinked polymer and non-crosslinked regions comprising non-crosslinked, water-soluble reactive polymer on the supporting side of the substrate, removing the non-crosslinked, water-soluble reactive polymer from the supporting side of the substrate, optionally, contacting the crosslinked polymer with the metal ion catalyst for aniline oxidation, followed by rinsing the crosslinked polymer, and contacting the crosslinked polymer with the aniline reactive composition, thereby forming a pattern of the electrically-conductive polyaniline disposed either within, on top of, or both within and on top of, the crosslinked polymer.

Still again, the method can further comprising:

providing a uniform layer of the same or different photocurable composition on an opposing supporting side of the substrate exposing the same or different photocurable composition on the opposing supporting side of the substrate to radiation sufficient to cause crosslinking via [2+2] photocycloaddition of the (b) recurring units, thereby forming a crosslinked polymer on the opposing supporting side of the substrate;

removing any non-crosslinked water-soluble reactive polymer from the opposing supporting side of the substrate;

optionally, contacting the crosslinked polymer on the opposing supporting side of the substrate with a metal ion catalyst for aniline oxidation, followed by rinsing the crosslinked polymer on the opposing supporting side of the substrate, and contacting the crosslinked polymer on the opposing supporting side of the substrate with an aniline reactive composition comprising an aniline monomer and up to 0.5 molar of an aniline oxidizing agent, in a molar ratio of from 1:0.5 to 1:1.5 of the aniline monomer to the aniline oxidizing agent, thereby forming an electrically-conductive polyaniline disposed either within, on top of, or both within and on top of, the crosslinked polymer on the opposing supporting side of the substrate.

In such embodiments, the method can also comprise:

exposing the uniform layer of the photocurable composition on the opposing supporting side of the substrate in an imagewise fashion, thereby forming a pattern of crosslinked regions comprising crosslinked polymer and non-crosslinked regions comprising non-crosslinked, water-soluble reactive polymer on the opposing supporting side of the substrate, removing the non-crosslinked, water-soluble reactive polymer from the opposing supporting side of the substrate to form a pattern of crosslinked polymer on the opposing supporting side of the substrate, optionally, contacting the pattern of crosslinked polymer on the opposing supporting side of the substrate with the metal ion catalyst for aniline oxidation, followed by rinsing the pattern of crosslinked polymer on the opposing supporting side of the substrate, and contacting the pattern of crosslinked polymer on the opposing supporting side of the substrate with the aniline reactive composition, thereby forming a pattern of the electrically-conductive polyaniline disposed either within, on top of, or both within and on top of, the pattern of crosslinked polymer on the opposing supporting side of the substrate.

The present invention provides a method for providing electrically-conductive polyaniline patterns or layers formed by oxidative polymerization of aniline, which polyaniline is disposed either within, on top of, or both within and on top of, within a pattern or layer of crosslinked polymer that serves as a durable and water-insoluble high resolution "template" as well as a polymerization catalyst and a stable dopant (provided by the pendant sulfonic acid or sulfonate groups) for emeraldine salt formation. The crosslinked polymer template can be formed by crosslinking an aqueous-soluble reactive polymer comprising two essential recurring units: (a) recurring units comprising sulfonic acid or sulfonate groups, and (b) recurring units that can be crosslinked via [2+2] photocycloaddition as described below. The water-soluble reactive polymer can be printed or otherwise disposed on one or both supportive sides of a suitable substrate such as a continuous flexible polymeric web and photo-crosslinked to form an insoluble hydrogel pattern, or it can be uniformly disposed onto the substrate and photo-patterned like a water-developable negative photo-resist.

The resulting insoluble hydrogel (crosslinked) pattern can be then immersed in an acidic aniline oxidizing (polymerization) bath where electrically-conductive emeraldine salt polyaniline grows within and on the crosslinked polymer at room temperature in for example 20 to 30 minutes. The catalytic properties of the crosslinked polymer can be improved by its immersion in a metal catalyst solution for example to form a ferric ion-polymer complex that reduces the aniline polymerization time to about 3 to 10 minutes with better selectivity for forming polyaniline only within or on the crosslinked template polymer. The present invention provides a simple route to electrically-conductive, water-insoluble, highly durable, and high resolution polyaniline layers or patterns that require no post-processing of the polyaniline.

The formation of patterns of the template polymer that can be photo-crosslinked on a substrate can be readily achieved using a variety of printing methods such as inkjet, gravure, screen printing, or photolithography when high resolution is required. The polyaniline formed within, on top of, or both within and on top of, the resulting crosslinked polymer requires no further processing to become electrically-conductive due to the inherent doping properties of the crosslinked template polymer.

DETAILED DESCRIPTION OF THE INVENTION

The following discussion is directed to various embodiments of the present invention and while some embodiments can be desirable for specific uses, the disclosed embodiments should not be interpreted or otherwise considered be limit the scope of the present invention, as claimed below. In addition, one skilled in the art will understand that the following disclosure has broader application than is explicitly described and the discussion of any embodiment.
Definitions As used herein to define various components of the photocurable composition, acidic aniline reactive composition, and water-soluble reactive polymer, metal ion catalyst solutions, unless otherwise indicated, the singular forms "a," "an," and "the" are intended to include one or more of the components (that is, including plurality referents).

Each term that is not explicitly defined in the present application is to be understood to have a meaning that is commonly accepted by those skilled in the art. If the construction of a term would render it meaningless or essentially meaningless in its context, the term definition should be taken from a standard dictionary.

The use of numerical values in the various ranges specified herein, unless expressly indicated otherwise, are considered to be approximations as though the minimum and maximum values within the stated ranges were both preceded by the word "about." In this manner, slight variations above and below the stated ranges can be used to achieve substantially the same results as the values within the ranges. In addition, the disclosure of these ranges is intended as a continuous range including every value between the minimum and maximum values.

Unless otherwise indicated, the term "weight %" refers to the amount of a component or material based on the total solids of a composition, formulation, pattern, or layer. Unless otherwise indicated, the percentages can be the same for either a dry layer or pattern, or for the total solids of the formulation or composition.

The term "homopolymer" is meant to refer to polymeric materials that have the same repeating or recurring unit along a polymer backbone. The term "copolymer" refers to polymeric materials composed of two or more different repeating or recurring units that are arranged in any order (randomly or otherwise) along the water-soluble reactive polymer backbone.

For the water-soluble reactive polymers used in the present invention, the recurring units can be arranged randomly along the reactive polymer backbone, or there can be blocks of recurring units that occur naturally during the polymerization process. Such water-soluble reactive polymers are copolymers.

Recurring units in the water-soluble reactive polymers described herein can be generally derived from the corresponding ethylenically unsaturated polymerizable monomers used in a polymerization process, which ethylenically unsaturated polymerizable monomers have the desired functional and pendant groups. Alternatively, desired pendant groups can be incorporated within recurring units after polymerization of ethylenically unsaturated polymerizable monomers by reaction with requisite precursor pendant groups.

The term "polymerization" is used herein to mean the combining, for example by covalent bonding, of a large number of smaller molecules, such as monomers, to form very large molecules, that is, macromolecules or polymers. The monomers can be combined to form only linear macromolecules or they can be combined to form three-dimensional macromolecules that are commonly referred to as crosslinked polymers. One type of polymerization that can be carried out in the practice of this invention is free radical polymerization when free radically ethylenically unsaturated polymerizable monomers and suitable free radical generating initiators are present.

The term "water-soluble reactive polymer" is used herein to refer to the copolymers described below that have the essential recurring units and described properties and that can be used in the photocurable compositions, articles, and methods described herein, and which copolymers are sensitive to ultraviolet radiation so that crosslinking occurs using the pendant groups in the (b) recurring units noted below.

In reference to water-soluble reactive polymers described herein, the term "water-soluble" is used to mean that the minimum solubility in water of a given water-soluble reactive polymer is at least 0.1 weight % at 25° C. and a homogeneous solutions are formed in water.

Unless otherwise noted, the term "crosslinked polymer" is used herein to refer to the crosslinked form of the corresponding water-soluble reactive polymer.

The term "aqueous-based" refers to solutions, baths, or dispersions in which the predominant solvent, or at least 50 weight % of the solvents, is water.

Unless otherwise indicated, the term "mol %" when used in reference to recurring units in water-soluble reactive polymers, refers to either the nominal (theoretical) amount of a recurring unit based on the molecular weight of ethylenically unsaturated polymerizable monomer used in the polymerization process, or to the actual amount of recurring units in the resulting water-soluble reactive polymer as determined using suitable analytical techniques and equipment.

Unless otherwise indicated, the term "group" particularly when used to define a substituent of a defined moiety, can itself be substituted or unsubstituted (for example and alkyl "group" refers to a substituted or unsubstituted alkyl). Generally, unless otherwise specifically stated, substituents on any "groups" referenced herein or where something is stated to be possibly substituted, include the possibility of any groups, whether substituted or unsubstituted, which do not destroy properties necessary for the utility of the component or aqueous metal catalytic composition. It will also be understood for this application that reference to a compound of a particular general structure includes those compounds of other more specific formula that fall within the general structural definition. Examples of substituents on any of the mentioned groups can include known substituents such as: halogen (for example, chloro, fluoro, bromo, and iodo); cyano; nitro; amino; alkoxy particularly those with 1 to 12 carbon atoms (for example, methoxy and ethoxy); substituted or unsubstituted alkyl groups, particularly lower alkyl groups (for example, methyl and trifluoromethyl); alkenyl or thioalkyl (for example, methylthio and ethylthio), particularly either of those with 1 to 12 carbon atoms; substituted and unsubstituted aryl, particularly those having from 6 to 20 carbon atoms in the aromatic ring (for example, phenyl);

and substituted or unsubstituted heteroaryl, particularly those having a 5- or 6-membered ring containing 1 to 3 heteroatoms selected from N, O, S or Se (for example, pyridyl, thienyl, furyl, pyrrolyl, and their corresponding benzo and naptho analogs); and other substituents that would be readily apparent in the art. Alkyl substituents particularly contain 1 to 12 carbon atoms and specifically include "lower alkyl" that is having from 1 to 6 carbon atoms, for example, methyl, ethyl, and t-butyl. Further, with regard to any alkyl group, alkylene group or alkenyl group, it will be understood that these can be branched or unbranched and include ring (cyclic) structures.

The term "UV radiation" is used herein to refer to electromagnetic radiation having a wavelength ($\lambda_{max}$) of at least 150 nm and up to and including 450 nm.

As used herein, all molecular weights are weight average molecular weights ($M_w$) that can be determined using known procedures and equipment if the values are not already known from the literature. For example, $M_w$ can be determined using Size Exclusion Chromatography (SEC) and values are typically reported as pullulan equivalent weights.

In defining various dimensions of pattern features and dry thickness, each dimension "average" is determined from at least 2 measurements of the specific dimension using appropriate measurement techniques and equipment that would be known to one skilled in the art. For example, the average dry thickness of photocurable, crosslinked polymer, or polyaniline layers described herein can be determined from the average of at least 2 separate measurements taken of a dry layer, for example, using electron microscopy. Similarly, the average dry thickness or width of lines, grid lines, or other pattern features described herein can be the average of at least 2 separate measurements taken, for example, using electron microscopy.

In many embodiments of substrates and articles described herein, the transparent substrate and all accompanying layers or patterns on one or both supporting sides, are considered transparent meaning that its integrated transmittance over the noted visible region of the electromagnetic spectrum (for example from 410 nm to 700 nm) is 70% or more, or more likely at least 80% or even 90% or more, as measured for example using a spectrophotometer and known techniques.

Uses

The articles and methods described herein include the use of water-soluble reactive polymers that can be used to form crosslinked polymer layers or patterns useful as "templates" within or on which layers or patterns of electrically-conductive polyaniline can be formed.

Touch screen technology can comprise different touch sensor configurations including capacitive and resistive touch sensors. Capacitive touch sensors can be used in electronic devices with touch-sensitive features. These electronic devices can include but are not limited to, televisions, monitors, and projectors that can be adapted to display images including text, graphics, video images, movies, still images, and presentations. The image devices that can be used for these display devices that can include cathode ray tubes (CRT), projectors, flat panel liquid crystal displays (LCD), light emitting diode (LED) systems, organic light emitting diode (OLED) systems, plasma systems, electroluminescent displays (ELD), and field emission displays (FED). For example, the present invention can be used to prepare capacitive touch sensors that can be incorporated into electronic devices with touch-sensitive features to provide computing devices, computer displays, portable media players including e-readers, mobile telephones and other communicating devices.

Systems and methods of fabricating flexible and optically compliant touch sensors in a high-volume roll-to-roll manufacturing process wherein micro electrically-conductive polyaniline features can be created in a single pass are possible using the present invention. The water-soluble reactive polymers can be used in such systems and methods with multiple printing members (such as flexographic printing members or inkjet printing) to form multiple high resolution electrically-conductive polyaniline images. Such multiple electrically-conductive polyaniline patterns can be formed on one or both supporting sides of a substrate. For example, one electrically-conductive polyaniline pattern can be provided on one supporting side of the substrate and a different electrically-conductive polyaniline pattern can be provided on the opposing supporting side of the substrate that can be a continuous web.

Water-soluble Reactive Polymers

In general, the water-soluble reactive polymers useful in the practice of this invention have two essential features. They comprise pendant groups that are capable of crosslinking via [2+2] photocycloaddition (defined below) upon exposure to suitable radiation. In addition, the water-soluble reactive polymers also comprise sulfonate or sulfonic acid groups that provide sufficient water-solubility or water-dispersibility as well as internal dopants for polyaniline formation after the water-soluble reactive polymer has been crosslinked. The water-soluble reactive polymers can be supplied as compositions in appropriate media.

The water-soluble reactive polymers can be either condensation or vinyl polymers as long as the requisite pendant crosslinkable and water-solubilizing sulfonate or sulfonic acid groups are connected to and arranged along the water-soluble reactive polymer backbone. In most embodiments, the water-soluble reactive polymers are vinyl polymers derived from appropriately selected ethylenically unsaturated polymerizable monomers using known free radical solution polymerization techniques and conditions, initiators, surfactants, catalysts, and solvents, all of which would be readily apparent to one skilled in the art from the teaching provided herein.

(a) Recurring Units Having Sulfonate or Sulfonic Acid Groups:

The water-soluble reactive polymers used in the present invention comprise (a) recurring units comprising sulfonic acid or sulfonate groups, or mixtures of both sulfonic acid and sulfonate groups. Such recurring units can be provided by polymerization of suitable ethylenically unsaturated polymerizable monomers containing such water-solubilizing groups such as vinyl sulfonic acid, styrene sulfonic acid, 2-acrylamido-2-methyl-1-propane sulfonic acid, 2-sulfoethyl methacrylate, 3-sulfopropyl methacrylate, styrene sulfonates, and 3-sulfopropyl acrylate. Partially or fully neutralized counterparts of such monomers are also often readily available and useful for certain polymer synthetic conditions.

Alternatively, such recurring units can be provided by polymerizing certain precursor ethylenically unsaturated polymerizable monomers that comprise pendant precursor groups that can in turn be reacted to provide the desired pendant sulfonic acid or sulfonate groups. For example, such monomers include but are not limited to, hydroxy or amino-containing compounds such as 2-hydroxyethyl acrylate, 2-hydroxyethyl methacrylate, 2-aminoethyl methacrylate, and 2-aminoethyl acrylate that can be reacted using a variety of sulfonating agents to provide the desired pendant sulfonic acid or sulfonate groups.

The recurring units described above having the sulfonic acid or sulfonate groups are present in the reactive polymers in an amount of at least 40 mol %, or more likely at least 50 mol % and up to and including 80 mol % or up to and including 95 mol %, all amounts based on the total recurring units in the water-soluble reactive polymer.

Crosslinkable (b) Recurring Units:

The water-soluble reactive polymers used in the present invention also comprise (b) recurring units comprising a pendant group capable of crosslinking via [2+2] photocycloaddition when appropriately exposed to suitable radiation. While not limited to the following examples, such photosensitive crosslinkable groups can be chosen from one or more of the following classes of photosensitive crosslinkable groups, all of which can be connected to a (b) recurring unit backbone that is derived from suitable ethylenically unsaturated polymerizable monomers:

(i) a photosensitive —C(=O)—CR=CR$^1$—Y group wherein R and R$^1$ are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is an aryl or heteroaryl group;

(ii) a photosensitive, non-aromatic unsaturated carbocyclic group;

(iii) a photosensitive, aromatic or non-aromatic heterocyclic group comprising a carbon-carbon double bond that is conjugated with an electron withdrawing group;

(iv) a photosensitive non-aromatic unsaturated heterocyclic group comprising one or more amide groups that are conjugated with a carbon-carbon double bond, which photosensitiv non-aromatic unsaturated heterocyclic group is linked to the water-soluble backbone at amide nitrogen atom, or (v) a photosensitive substituted or unsubstituted 1,2-diarylethylene group.

Multiple photosensitive crosslinkable groups can be present from the same or multiple different classes of the crosslinkable groups (i) through (v).

Upon exposure to suitable radiation having a $\lambda_{max}$ of at least 150 nm and up to and including 700 nm, or more likely exposure to radiation having a $\lambda_{max}$ of at least 150 nm and up to and including 450 nm, the noted photosensitive crosslinkable groups are electronically excited such that they can react with other pendant groups in the water-soluble reactive polymer to form crosslinks for example as the product of photocycloaddition reactions.

The water-soluble reactive polymers particularly become crosslinked among adjacent or proximate (molecularly near enough for [2+2] photocycloaddition crosslinking) crosslinkable groups during or after the noted irradiation. Thus, essential crosslinking can be accomplished using the water-soluble reactive polymer without additional crosslinking agents. However, if desired, crosslinking can be further provided using distinct compounds that are dispersed as crosslinking agents within the compositions or layers comprising one or more water-soluble reactive polymers. Such crosslinking agents react at either the crosslinkable groups or at other pendant groups such as carboxylic acid groups depending upon the chemical structure of crosslinking agent. For the pendant crosslinkable groups described herein, crosslinking is achieved by having at least two of such crosslinkable groups in proximity that can react with one another.

The crosslinkable [2+2] photocycloaddition groups incorporated into the water-soluble reactive polymers can absorb photoexposing radiation as described above to form an electronically excited state that can undergo pericyclic ring formation to form stable covalent crosslinks. These crosslinks between the polymer chains cause the water-soluble reactive polymer to become water-insoluble (or crosslinked), although the water-insoluble (crosslinked) reacted polymer can still absorb and transport water, ions, or other small molecules. The photoexpo sing radiation can be followed by additional curing or heating procedures (described below) to allow the excited [2+2] photocycloaddition groups to properly align with non-excited [2+2] photocycloaddition groups to form additional crosslinks. Curing can be shortened using heat with the curing irradiation.

The crosslinked, water-insoluble complex containing the crosslinked polymer is crosslinked at a level that imparts water-insolubility and adhesion to a substrate, but still allows rapid diffusion of water, metal ions, and other small molecules. This type of water-compatible crosslinked material is sometimes referred to as a hydrogel.

The (b) recurring units comprising the noted photosensitive crosslinkable [2+2] photocycloaddition groups can be present in the water-soluble reactive polymers in an amount of at least 5 mol % or typically at least 5 mol % and up to and including 30 mol %, or even at least 10 mol % and up to and including 20 mol %, all amounts based on the total recurring units in the water-soluble reactive polymer.

In the (i) class of pendant photosensitive, crosslinkable groups that can be present in recurring units arranged along the water-soluble reactive polymer backbone can comprise —C(=O)—CR=CR$^1$—Y groups wherein R, R$^1$, and Y are defined as follows.

Specifically, R and R$^1$ can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and R$^1$ can also be nitro, cyano, or halogen groups.

More particularly, R and R$^1$ can be independently hydrogen or substituted or unsubstituted methyl, ethyl or phenyl groups, especially when Y is a substituted or unsubstituted phenyl group as described below.

Y can be a substituted or unsubstituted carbocyclic aryl group, or a substituted or unsubstituted heteroaryl group having one or more heteroatoms (oxygen, sulfur, or nitrogen) and sufficient carbon atoms to complete an aromatic heterocyclic ring. Such aromatic rings can have one or more substituents that do not adversely affect the desired behavior in the crosslinking reactions induced by the irradiation described herein.

Useful Y groups can be either heterocyclic or carbocyclic rings having desired aromaticity and any of these rings can be substituted with one or more substituents that do not adversely affect the function of the reactive polymer.

Representative aromatic Y groups include but are not limited to, substituted or unsubstituted phenyl, naphthyl, anthracyl, 4-nitrophenyl, 2,4-dichlorophenyl, 4-ethylphenyl, tolyl, 4-dodecylphenyl, 2-nitro-3-chlorophenyl, 4-methoxyphenyl, 2-furyl, 2-thienyl, 3-indolyl, and 3-pyridyl rings. The substituted or unsubstituted phenyl rings are particularly useful including but not limited to phenyl, tolyl, xylyl, 4-methoxyphenyl, hydroxyphenyl, and chlorophenyl groups. Substituted or unsubstituted phenyl or 3-pyridyl groups are particularly useful Y groups.

The pendant groups comprising the crosslinkable and photosensitive —C(=O)—CR=$CR^1$—Y groups are therefore connected to the water-soluble reactive polymer backbone by means of a single connecting bond or a linking group ($R^2$) as described below.

In particular, the essential (b) recurring units comprising the noted crosslinkable groups can be derived from any ethylenically unsaturated polymerizable monomer having appropriate pendant groups comprising one or more crosslinkable —C(=O)—CR=$CR^1$—Y groups wherein R, $R^1$, and Y are as defined above.

More particularly, such (b) recurring units can be further defined in reference to the following Structure (-$A_i$-) comprising crosslinkable groups:

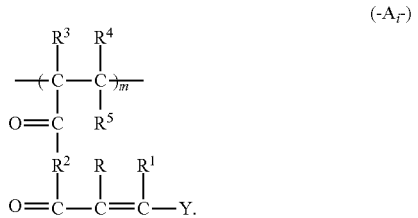

In Structure (-$A_i$-), R, $R^1$, and Y are as defined above. $R^2$ can be a divalent linking group including but are not limited to, substituted or unsubstituted alkylene (including haloalkylenes and cyanoalkylenes), alkyleneoxy, alkoxyalkylene, iminoalkylene, cycloalkylene, aralkylene, cycloalkylenealkylene, and aryloxyalkylene groups wherein the divalent hydrocarbon groups can comprise 1 to 20 carbon atoms (in either linear, branched, or cyclic form). A skilled worker in polymer chemistry would be able to design other useful linking groups using suitable number of carbon and hetero (oxygen, nitrogen, or sulfur) atoms in an order and arrangement that are chemically possible. Particularly useful $R^2$ divalent groups are substituted or unsubstituted alkylene groups such as substituted or unsubstituted ethylene or propylenes.

$R^3$, $R^4$, and $R^5$ can be independently hydrogen, a halogen, a substituted or unsubstituted alkyl group having 1 to 6 carbon atoms, a substituted or unsubstituted cyclohexyl group, or a substituted or unsubstituted phenyl group. In particular, $R^3$, $R^4$, and $R^5$ can be independently hydrogen, chloro, methyl, or ethyl groups.

Some particularly useful ethylenically unsaturated polymerizable monomers from which -$A_i$- recurring units can be derived include:
2-cinnamoyl-ethyl methacrylate,
2-cinnamoyl-ethyl acrylate, and
2-[3-(3-pyridyl)acryloyl]ethyl methacrylate.

The -$A_i$- recurring units can also be formed after formation of a water-soluble precursor reactive polymer having precursor -$A_i$- recurring units. For example, a water-soluble precursor reactive polymer can be prepared with recurring units derived from vinyl alcohols or acrylate monomers having pendant hydroxyl groups, and the pendant hydroxyl groups can be reacted with cinnamoyl chloride (or similar substituted cinnamoyl-like chloride reactants) to form the desired -$A_i$- (or similar) recurring units with pendant precursor groups such as alcohols or amines that are already present before the reaction to form the -$A_i$- recurring units.

(ii) Another class of useful photosensitive crosslinkable groups arranged along the water-soluble reactive polymer backbone can comprise pendant photosensitive (crosslinkable), non-aromatic unsaturated carbocyclic groups including but not limited to, cyclopropene groups, cyclobutene groups, cyclopentadiene groups, cyclohexene groups, cyclohexadiene groups, cycloheptene groups, cycloheptadiene groups, cycloheptatriene groups, cyclooctene groups, indene groups, dihydronaphthalene groups, and norbornene groups. Any of these photosensitive groups can be substituted with one or more substituents that will not interfere with the desired properties of the water-soluble reactive polymer. Where appropriate, such non-aromatic unsaturated carbocyclic groups can also contain one or more carbon-containing fused rings. The cyclopropene groups including the unsaturated cyclopropene groups can be particularly useful.

In general, such useful (b) recurring units can be represented by the following Structure (-$A_{ii}$-):

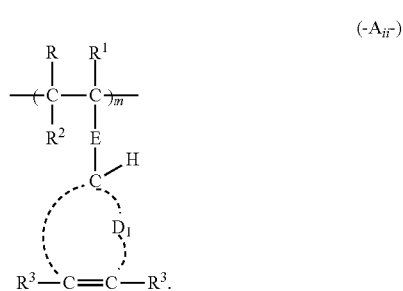

Specifically, R, $R^1$, and $R^2$ in Structure (-$A_{ii}$-) can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and $R^1$ can also be nitro, cyano, or halogen groups.

More particularly, R, $R^1$, and $R^2$ in Structure (-$A_{ii}$-) can be independently hydrogen or substituted or unsubstituted methyl, ethyl or phenyl groups, and more particularly, each of these groups is hydrogen or methyl.

E can be a divalent linking group including but not limited to, substituted or unsubstituted alkylene (including haloalkylenes and cyanoalkylenes), alkyleneoxy, alkoxyalkylene, iminoalkylene, cycloalkylene, aralkylene, cycloalkylenealkylene, aryloxyalkylene groups wherein the divalent hydrocarbon groups can comprise 1 to 20 carbon atoms (in either linear, branched, or cyclic form), carbonyloxy, oxycarbonyl, amido, keto, carbonate, carbamate, and urea. A skilled worker in polymer chemistry would be able to design other useful linking groups using suitable number of carbon and hetero (oxygen, nitrogen, or sulfur) atoms in an order and arrangement that are chemically possible. Particularly useful E divalent groups are substituted or unsubstituted alkylene groups such as substituted or unsubstituted ethylene or propylenes, or oxycarbonyl.

In Structure ($-A_{ii}-$), $D_1$ can represent the carbon atoms necessary to complete a three-membered to seven-membered non-aromatic unsaturated carbocyclic group (or ring), or particularly the carbon atoms necessary to complete a non-aromatic, unsaturated 3-membered to 7-membered carbocyclic group (or ring) such as a cyclopropene ring, a cyclobutene ring, a cyclopentene ring, a cyclohexene ring, or a cycloheptene ring. $D_1$ can also represent the saturated or unsaturated carbon atoms to provide an indene or dihydronaphthalene group, or polycyclic rings such as a norbornene group.

Moreover, in Structure ($-A_{ii}-$), $R^3$ can be hydrogen, a substituted or unsubstituted alkyl group having 1 to 12 carbon atoms (such as methyl, ethyl, isopropyl, amyl, hexyl, nonyl, decyl, and dodecyl), or a substituted or unsubstituted aryl group having 6 or 10 carbon atoms in the ring. Such groups can be substituted with one or more hydroxy, halogen, carbonyl, cyano, alkyl, or alkoxy groups.

In Structure ($-A_{ii}-$), m can represent the molar amounts of the recurring units that would satisfy the amounts described above for the water-soluble polymer.

Some particularly useful recurring units of this type represented by the following Structure ($-A_{ii2}-$) or ($-A_{ii3}-$):

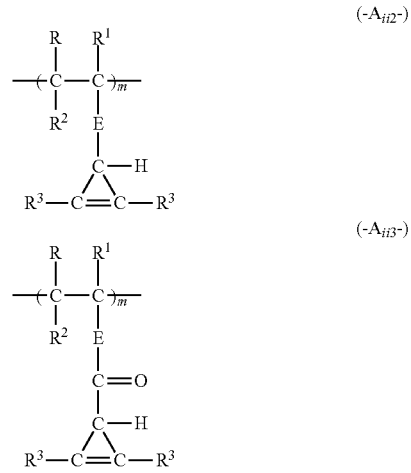

wherein R, $R^1$, $R^2$, $R^3$, and E are as defined above for Structure ($-A_i-$).

Some useful recurring units of this type can be derived from:

2-cyclopropene-1-carboxylic acid, 2,3-diphenyl-, 2-[(2-methyl-1-oxo-2-propen-1-yl)oxy]ethyl ester;

2-cyclopropene-1-carboxylic acid, 2,3-diphenyl-, 2-[(2-methyl-1-oxo-2-propen-1-yl)amino]ethyl ester;

4-(2,3-diphenyl-2-cyclopropene-1-carbonyloxy) styrene;

4(2,3-diphenyl-2-cyclopropene-1-carbonylamino) styrene; and 4-(2,3-diphenyl-2-cyclopropene-1-carbonyloxy) ethane.

These recurring units can be derived from suitable ethylenically unsaturated polymerizable monomers that can then be polymerized under suitable conditions to provide useful water-soluble reactive polymers.

Yet another class (iii) of photosensitive crosslinking groups in the water-soluble reactive polymers comprise pendant photosensitive (crosslinkable), aromatic or non-aromatic heterocyclic groups, each of which comprises a carbon-carbon double bond ($>C=C<$) that is conjugated with one or more electron withdrawing groups. In many embodiments, the carbon-carbon double bond is conjugated with one or two of the same or different electron withdrawing groups, and in most embodiments, the carbon-carbon double bond is conjugated with only one electron withdrawing group.

It is to be understood that the pendant photosensitive, aromatic or non-aromatic heterocyclic groups can be single ring groups formed of carbon and hetero atoms (such as nitrogen, sulfur, and oxygen), or they can be fused ring groups with two or more fused rings formed from carbon and suitable heteroatoms.

Useful electron withdrawing groups that can be conjugated with the carbon-carbon double bond would be readily apparent to one skilled in the art as the term "electron withdrawing" in reference to a chemical group is well known in the art. However, it is particularly useful when such electron withdrawing groups include but are not limited to, carbonyl, ester, thioester, amide, imine, amidine, ether, thioether, and amine groups (or moieties). More generally, the photosensitive (crosslinkable) aromatic or non-aromatic heterocyclic group can be a cyclic group that comprises an α,β-unsaturated ketone, α,β-unsaturated lactone, α,β-unsaturated lactam, α,β-unsaturated ether, α,β-unsaturated thioether, or α,β-unsaturated amine group. Of these types of photosensitive (crosslinkable) aromatic or non-aromatic heterocyclic groups, those containing a carbonyl group are particularly useful.

For example, the water-soluble reactive polymers can comprise pendant photosensitive, aromatic or non-aromatic heterocyclic groups selected from the group consisting of coumarin, thiocoumarin, quinone, benzoquinone, naphthoquinone, pyran, thiopyran, benzopyran, benzothiopyran, pyranone, thiopyranone, pyridinone, quinoline, and quinolinone groups. Of these photosensitive aromatic or non-aromatic heterocyclic groups, pendant photosensitive coumarin or quinolinone groups are useful and the pendant photosensitive coumarin groups are most useful because they can be readily prepared.

Any of the photosensitive aromatic or non-aromatic heterocyclic groups can be substituted with one or more substituents that will not interfere with the desired properties of the water-soluble reactive polymer.

In general, other useful (b) recurring units can be represented by the following Structure ($-A_{iii}-$):

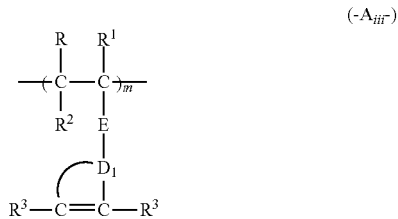

Specifically, in Structure ($-A_{iii}-$), R, $R^1$, and $R^2$ can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R and $R^1$ can also be nitro, cyano, or halogen groups.

More particularly, R, $R^1$, and $R^2$ can be independently hydrogen or substituted or unsubstituted methyl, ethyl or phenyl groups, and more particularly, each of these groups can be hydrogen or methyl.

E in Structure ($-A_{iii}-$) can be a single bond or divalent linking group that can be connected to a carbon atom within $D_1$. Thus, while E appears to be connected directly to $D_1$, E can be connected to any carbon represented by $D_1$. For example, E can be a divalent linking group including but not limited to, substituted or unsubstituted alkylene (including haloalkylenes and cyanoalkylenes), alkyleneoxy, alkoxyalkylene, iminoalkylene, cycloalkylene, aralkylene, cycloalkylene-alkylene, aryloxyalkylene groups wherein the divalent hydrocarbon groups can comprise 1 to 20 carbon atoms (in either linear, branched, or cyclic form), carbonyloxy, oxycarbonyl, amido, keto, carbonate, carbamate, and urea. A skilled worker in polymer chemistry would be able to design other useful linking groups using suitable number of carbon and hetero (oxygen, nitrogen, or sulfur) atoms in an order and arrangement that are chemically possible. Particularly useful E divalent groups are substituted or unsubstituted alkylene groups such as substituted or unsubstituted ethylene or propylenes or oxycarbonyl.

In Structure ($-A_{iii}-$) $D_1$ represents the carbon and hetero (sulfur, oxygen, or nitrogen particularly) atoms necessary to complete a three-membered to fourteen-membered aromatic or non-aromatic heterocyclic group (or ring) that includes the carbon-carbon double bond shown in Structure ($-A_{iii}-$). However, it is essential that either $D_1$ or at least one of the $R^3$ groups (defined below) comprises at least one (and optionally more) electron withdrawing groups that are conjugated with the carbon-carbon double bond shown in Structure ($-A_{iii}-$).

$D_1$ can also represent the saturated or unsaturated carbon or hetero atoms to provide one or more fused rings such as naphthoquinone, benzopyran, benzothiopyran, benzopyran-2-one (coumarin), quinoline, and quinolinone polyrings. Other useful $D_1$ ring systems optionally comprising at least one electron withdrawing group that is conjugated with the carbon-carbon double bond would be readily apparent to one skilled in the art.

Moreover, in Structure ($-A_{iii}-$) $R^3$ is hydrogen, a substituted or unsubstituted alkyl group having 1 to 12 carbon atoms (such as methyl, ethyl, isopropyl, amyl, hexyl, nonyl, decyl, and dodecyl), a substituted or unsubstituted aryl group having 6 or 10 carbon atoms in the ring, a substituted or unsubstituted alkoxy group having 1 to 12 carbon atoms (such as methoxy, 2-ethoxy, t-butoxy, and n-hexoxy), substituted or unsubstituted aryloxy group having 6 or 10 carbon atoms in the ring (such as phenoxy and naphthoxy), cyano, halo, or carbonyl-containing group. Such carbonyl-containing groups include but are not limited to, aldehyde, ketone, carboxylic acid, ester, and amide groups. Such carbonyl-containing groups can be conjugated with the carbon-carbon double bond in Structure (A).

In Structure ($-A_{iii}-$), m can represent the molar amounts of the noted recurring units as described above for the water-soluble reactive polymers.

Some useful recurring units of this type can be derived from:

7-(2-methacryloyloxyethoxy)-4-methylcoumarin,
7-(2-methacryloyloxyethoxy)-coumarin,
7-(3-methacryloyloxysulfopropyl)-4-methylcoumarin,
7-(methacryloyloxy)-4-methylcoumarin,
6-(methacryloyloxy)-4-methylcoumarin,
6-(2-methacryloyloxyethoxy)-4-methylcoumarin,
7-(2-methacryloyloxyethoxy)-quinoline-2-one,
7-(2-methacryloyloxyethoxy)-4-methylquinoline-2-one, and
5-(2-methacryloyloxyethoxy)-naphthoquinone.

The useful (b) recurring units can be derived from suitable ethylenically unsaturated polymerizable monomers that can then be polymerized under suitable conditions to provide useful water-soluble reactive polymers.

Yet another class (iv) comprise pendant photosensitive (crosslinkable), non-aromatic unsaturated heterocyclic groups, each of which non-aromatic unsaturated heterocyclic groups can comprise one or more amide groups [>N—C(=O)—], and each of the amide groups is arranged in the heterocyclic group (ring) in conjugation with a carbon-carbon double bond (>C=C<). In many embodiments, such heterocyclic groups have only one or two amide groups and the carbon-carbon double bond is conjugated with the one or two amide groups arranged within the non-aromatic unsaturated heterocyclic group (ring). In most embodiments, the carbon-carbon double bond is conjugated with the only one amide group in the non-aromatic unsaturated heterocyclic group (ring).

It is to be understood that the pendant photosensitive, non-aromatic unsaturated heterocyclic groups can be single ring groups formed of carbon and hetero atoms (such as nitrogen, sulfur, and oxygen), or they can be fused ring groups with two or more fused rings formed from carbon and suitable heteroatoms. In most embodiments, the photosensitive, non-aromatic unsaturated heterocyclic groups are single ring groups having 5 to 7 carbon and heteroatoms (usually nitrogen atoms) forming the ring. At least one, and likely two of the carbon atoms in the rings also form carbonyl (>C=O) groups.

Particularly useful water-soluble reactive polymers can comprise pendant photosensitive, non-aromatic unsaturated heterocyclic groups selected from the group consisting of substituted or unsubstituted maleimide and thymine groups. Of these photosensitive non-aromatic unsaturated heterocyclic groups, the substituted maleimide groups are most useful because they can be readily prepared.

Any of the photosensitive non-aromatic unsaturated heterocyclic groups can be substituted with one or more substituents that will not interfere with the desired properties of the water-soluble reactive polymer and the reactions necessary for crosslinking.

In general, useful (b) recurring units also can be represented by the following Structure ($-A_{iv}-$):

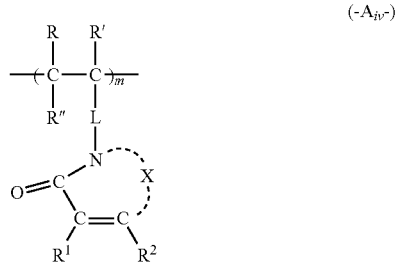

In Structure (-A$_{iv}$-), R, R', and R" can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R, R', and R" can also be nitro, cyano, or halogen groups.

More particularly, R, R', and R" can be independently hydrogen or substituted or unsubstituted methyl, ethyl or phenyl groups, and more particularly, each of these groups can be hydrogen or methyl.

In Structure (-A$_{iv}$-), L can be a single bond or divalent linking group that can be connected to a nitrogen atom (as shown) within the photosensitive non-aromatic unsaturated heterocyclic group. For example, L can be a divalent hydrocarbon or aliphatic linking group that generally include 1 to 10 carbon, nitrogen, or oxygen atoms in the chain and can include but not limited to, substituted or unsubstituted alkylene (including haloalkylenes and cyanoalkylenes); alkyleneoxy; alkoxyalkylene; iminoalkylene; cycloalkylene; aralkylene; cycloalkylene-alkylene; or aryloxyalkylene groups wherein the divalent hydrocarbon groups can comprise 1 to 20 carbon atoms (in either linear, branched, or cyclic form) and can be connected or interrupted with heteroatom-containing groups such as oxy, carbonyl, carbonyloxy, oxycarbonyl, amino, amido, carbonate, carbamate, and urea, or any combination thereof. A skilled worker in polymer chemistry would be able to design other useful linking groups using suitable number of carbon and hetero (oxygen, nitrogen, or sulfur) atoms in an order and arrangement that are chemically possible. Particularly useful L divalent groups are substituted or unsubstituted alkylene groups such as substituted or unsubstituted methylene, ethylene, or a propylene (any isomer), or such groups can be used in combination with an oxycarbonyl (such as from an acrylic acid ester group).

In Structure (-A$_{iv}$-), X represents the 1 to 3 carbon and heteroatoms (usually nitrogen atoms), which in combination with the remaining shown nitrogen and carbon atoms, complete a five- to seven-membered photosensitive non-aromatic unsaturated heterocyclic ring. In most embodiments, X represents at least one carbon atom (for example, a carbonyl carbon atom), or at least one carbon atom (for example, a carbonyl carbon atom) and at least one nitrogen atom such that the resulting amide group is conjugated with the shown carbon-carbon double bond.

In Structure (-A$_{iv}$-), $R^1$ and $R^2$ are independently hydrogen or a substituted or unsubstituted alkyl group having 1 to 10 carbon atoms (such as substituted or unsubstituted methyl, ethyl, isopropyl, amyl, hexyl, nonyl, and decyl groups), or a substituted or unsubstituted cycloalkyl group having 5 or 6 carbon atoms in the unsaturated carbocyclic ring (such as substituted cyclohexyl groups). $R^1$ and $R^2$ are likely to be the same group such as hydrogen, or unsubstituted methyl or unsubstituted ethyl groups.

Some particular useful representations of such (b) recurring units are shown in the following Structures (-A$_{iv1}$-), (-A$_{iv2}$-), and (-A$_{iv3}$-)

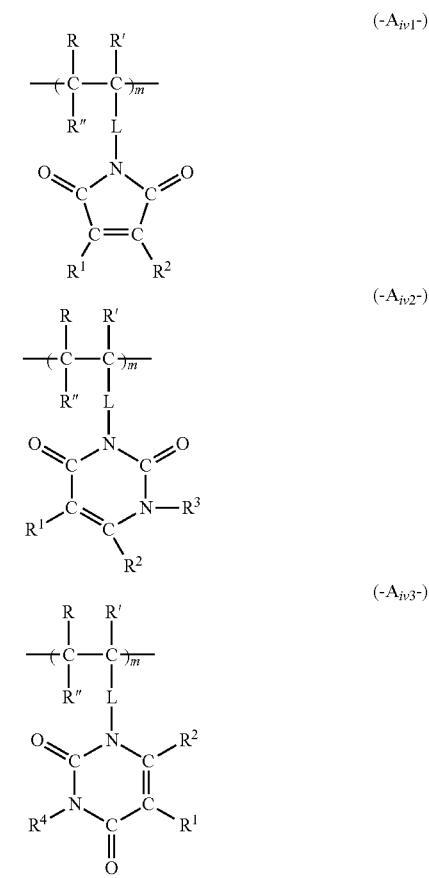

wherein R, R', R", L, $R^1$, and $R^2$ are as defined above in Structure (-A$_{iv}$-) and m is defined below.

Moreover, in Structures (-A$_{iv2}$-) and (-A$_{iv3}$-), $R^3$ and $R^4$ are independently hydrogen, or substituted or unsubstituted alkyl groups or substituted or unsubstituted cycloalkyl groups for example as used to define $R^1$ and $R^2$ shown above.

It should be understood that a water-soluble reactive polymer used in this invention can comprise a variety of different photosensitive non-aromatic unsaturated heterocyclic groups in recurring units. For example, the water-soluble reactive polymer can have (b) recurring units represented by both Structures (-A$_{iv1}$-) and either (-A$_{iv2}$-) or (-A$_{iv3}$-). Alternatively, the water-soluble reactive polymer can have (b) recurring units represented by both Structures (-$A_{iv2}$-) and (-$A_{iv3}$-). Still again, the water-soluble reactive polymer can have (b) recurring units represented by all of Structure (-$A_{iv1}$-), (-$A_{iv2}$-), and (-$A_{iv3}$-).

Some useful (b) recurring units of this type can be derived from:

N-(2-methacryloyloxyethyl)-2,3-dimethylmaleimide; and
3-(2-(methacryloyloxyethyl)-thymine.

The useful recurring units can be derived from suitable ethylenically unsaturated polymerizable monomers that can then be polymerized under suitable conditions to provide useful water-soluble reactive polymers.

Still another class (v) of useful photosensitive and cross-linkable pendant groups comprises photosensitive substituted or unsubstituted 1,2-diarylethylene groups. Such groups can be generally represented as —$Ar_1$-ethylene-$Ar_2$ wherein $Ar_1$ is a divalent, substituted or unsubstituted heterocyclic or carbocyclic aromatic group and $Ar_2$ is a monovalent, substituted or unsubstituted heterocyclic or carbocyclic aromatic group.

For example, some useful water-soluble reactive polymers comprise pendant groups comprising photosensitive substituted or unsubstituted 1,2-diaryl ethylene groups selected from stilbene, styrylnaphthalene, styrylpyridine, styrylpyridinium, styrylquinoline, styrylquinolinium, styrylthiazole, styrylthiazolium, naphthrylphenyl (naphthylene-ethylene-phenyl), naphthrylpyridinium, naphthylthiazolium, 1-pyridyl-2-thiazolylethylene, and 1,2-pyridiylethylene groups. The pendant groups comprising photosensitive stilbene, styrylpyridinium, styrylquinoline, or styrylthiazolium groups are particularly useful.

Any of the photosensitive 1,2-diarylethylene groups can be substituted with one or more substituents that will not interfere with the desired properties of the water-soluble reactive polymer and the reactions necessary for crosslinking.

In general, such useful (b) recurring units can be represented by the following Structure (-$A_v$-) showing both water-soluble reactive polymer backbone and pendant groups attached thereto:

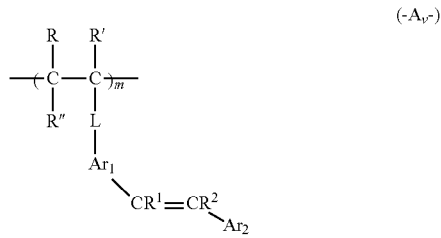

(-$A_v$-)

In Structure (-$A_v$-), R, R', and R" can be independently hydrogen or substituted or unsubstituted alkyl groups having at least 1 to 7 carbon atoms (including substituted or unsubstituted methyl, ethyl, isopropyl, t-butyl, hexyl, and benzyl groups, and others that would be readily apparent to one skilled in the art), substituted or unsubstituted cycloalkyl group having 5 or 6 carbon atoms in the ring (such as cyclopentyl, cyclohexyl, 4-methylcyclohexyl, and others that would be readily apparent to one skilled in the art), substituted or unsubstituted phenyl groups (such as phenyl, tolyl, and xylyl groups, and others that would be readily apparent to one skilled in the art), substituted or unsubstituted alkoxy groups having 1 to 7 carbon atoms (such as methoxy, ethoxy, benzoxy, and others readily apparent to one skilled in the art), or substituted or unsubstituted phenoxy groups (such as phenoxy, 2,4-dimethylphenoxy, and others that would be readily apparent to one skilled in the art). In some embodiments, R, R', and R" can also be nitro, cyano, or halogen groups.

More particularly, R, R', and R" can be independently hydrogen or substituted or unsubstituted methyl, ethyl or phenyl groups, and more particularly, each of these groups can be hydrogen or substituted or unsubstituted methyl groups.

In Structure (-$A_v$-), L can be a single bond or divalent linking group that can be connected to a nitrogen atom (as shown) within the photosensitive non-aromatic unsaturated heterocyclic group. For example, L can be a divalent hydrocarbon or aliphatic linking group that generally include 1 to 10 carbon, nitrogen, or oxygen atoms in the chain and can include but not limited to, substituted or unsubstituted alkylene (including haloalkylenes and cyanoalkylenes); alkyleneoxy; alkoxyalkylene; iminoalkylene; cycloalkylene; aralkylene; cycloalkylene-alkylene; or aryloxyalkylene groups wherein the divalent hydrocarbon groups can comprise 1 to 20 carbon atoms (in either linear, branched, or cyclic form) and can be connected or interrupted with heteroatom-containing groups such as oxy, carbonyl, carbonyloxy, oxycarbonyl, amino, amido, carbonate, carbamate, and urea, or any combination thereof. A skilled worker in polymer chemistry would be able to design other useful linking groups using suitable number of carbon and hetero (oxygen, nitrogen, or sulfur) atoms in an order and arrangement that are chemically possible. Particularly useful L divalent groups can be substituted or unsubstituted alkylene groups such as substituted or unsubstituted methylene, ethylene, or a propylene (any isomer), or such groups can be used in combination with an oxycarbonyl (such as from an acrylic acid ester group), and aliphatic groups comprising a carbonyloxy group directly attached to the water-soluble reactive polymer backbone.

Moreover, in Structure (-$A_v$-), $Ar_1$ is a divalent carbocyclic or heterocyclic aromatic group that can be substituted or unsubstituted. For example, $Ar_1$ can be substituted or unsubstituted phenylene, substituted or unsubstituted naphthylene, substituted or unsubstituted pyridinylene, substituted or unsubstituted quinolinylene, substituted or unsubstituted thiazolylene, substituted or unsubstituted pyridinium, substituted or unsubstituted quinolinium, or substituted or unsubstituted thiazolium. As would be understood by one skilled in the art, some of the useful $Ar_1$ groups can be quaternary aromatic rings wherein a nitrogen atom in the aromatic ring is optionally attached to L or is quaternized in a suitable manner, and suitable counterions can be present such as a trifluoromethylsulfonate counterion. When the $Ar_1$ rings are substituted, the one or more substituents can be any moiety that will not adversely affect the photosensitivity of the pendant group or any other properties intended for the water-soluble reactive polymer. For example, useful substituents can include but are not limited to methyl groups and ethyl groups. Particularly useful An groups are substituted or unsubstituted phenylene and pyridinium groups.

$Ar_2$ can be a substituted or unsubstituted carbocyclic or heterocyclic aromatic group as defined for $Ar_1$ except that $Ar_2$ is monovalent as shown in Structure (-$A_v$-). Particularly useful $Ar_2$ groups are substituted or unsubstituted phenyl, substituted or unsubstituted naphthalene, substituted or unsubstituted pyridine, substituted or unsubstituted pyridinium, substituted or unsubstituted quinoline, substituted or unsubstituted quinolinium, substituted or unsubstituted thiazole, and substituted or unsubstituted thiazolium groups, with substituted or unsubstituted phenyl, substituted or unsubstituted pyridinium, substituted or unsubstituted quinolinium groups, and substituted or unsubstituted thiazolium groups being particularly useful. Similarly to $Ar_1$, some of the $Ar_2$ aromatic rings can be quaternary aromatic rings having a positive nitrogen atom, and a suitable counterion, such as trifluoromethylsulfonate, is then present. A skilled worker in the art would readily know about other suitable counterions.

Moreover, In Structure $(-A_v-)$, $R^1$ and $R^2$ are independently hydrogen or substituted or unsubstituted alkyl groups having 1 to 10 carbon atoms (such as substituted or unsubstituted methyl, ethyl, isopropyl, amyl, hexyl, nonyl, and decyl groups), or substituted or unsubstituted cycloalkyl groups having 5 or 6 carbon atoms in the unsaturated carbocyclic ring (such as substituted cyclohexyl groups). $R^1$ and $R^2$ are likely to be the same group such as hydrogen, or unsubstituted methyl or unsubstituted ethyl groups.

In some embodiments, the water-soluble reactive polymer comprises (b) recurring units represented by the following Structure $(-A_{v1}-)$ also showing water-soluble reactive polymer backbone to which pendant groups are attached:

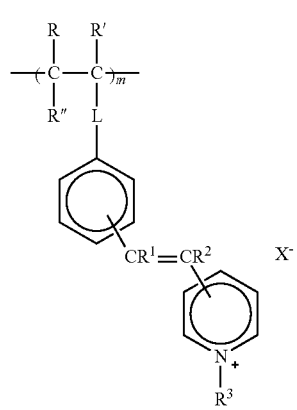

$(-A_{v1}-)$ wherein R, R', R" are as defined above and are particularly hydrogen or methyl, L is as described above and particularly comprises a carbonyloxy group directly attached to the backbone, $R^1$ and $R^2$ can be independently hydrogen, methyl, or ethyl, $R^3$ can be a suitable substituted or unsubstituted alkyl, substituted or unsubstituted cycloalkyl, or substituted or unsubstituted aryl group, $X^-$ can be a suitable counterion as described above, and m is as defined below.

In Structures $(-A_v-)$ and $(-A_{v1}-)$, m can represent the molar amounts of the (b) recurring units as described above for the water-soluble reactive polymers.

Some useful (b) recurring units of this class can be derived from:
1-methyl-4-[2-(4-(2-methacryloxyethyl)-carbonyloxyphenyl)ethenyl]pyridinium trifluormethylsulfonate;
1-methyl-4-[2-(4-(2-methacryloxyethyl)-carbonyloxyphenyl)ethenyl]quinolinium trifluoromethylsulfonate;
1-methyl-2-[2-(4-(2-methacryloxyethyl)-carbonyloxyphenyl)ethenyl]thiazolium trifluoromethylsulfonate;
4-[2-(4-(2-methacryloxyethyl)-carbonyloxyphenyl)ethenyl] pyridine; and
1-phenyl-2-[(4-(2-methacryloxyethyl)-carbonyloxyphenyl] ethylene.

Such useful (b) recurring units can be derived from suitable ethylenically unsaturated polymerizable monomers that can then be polymerized under suitable conditions to provide useful water-soluble reactive polymers. More likely, such monomers are prepared by attaching a 1,2-diarylethylene group to a polymerizable acrylic group through a linking group by formation of an ester, amide or ether bond. For example 4-formylbenzoic acid can be easily condensed with 4-methylpyridine to form a styrylpyridine group with a carboxylic acid functionality suitable for attachment to a linking group on an acrylic monomer such as 2-hydroxyethylmethacrylate. The carboxylic acid and the hydroxyethyl groups can then be attached by a variety of ester forming reactions well known in the art including the known Mitsunobu reaction.

Optional (c) and (d) Recurring Units:

The water-soluble reactive polymers used according to the present invention can optionally comprise at least 1 mol % and up to and including 65 mol %, or typically at least 1 mol % and up to and including 30 mol %, or even at least 1 mol % and up to and including 15 mol %, of (c) recurring units comprising pendant amide, hydroxyl, lactam, phosphonic acid (or phosphonate), or carboxylic acid (or carboxylate) groups, all based on the total amount of recurring units in the water-soluble reactive polymer. Recurring units comprising pendant hydroxyl, amide, or carboxylic acid groups are particularly useful. It is also useful to have (c) recurring units that comprise multiple different pendant groups from the noted list of pendant groups.

Useful pendant precursor groups include but are not limited to, anhydrides, alcohols, amines, lactam, lactone, amide, and ester groups that can be used to provide the various groups noted above for the (c) recurring units.

For example, useful (c) recurring units can be represented by the following Structure (—C—):

(-C-)

wherein B' represents a pendant amide, hydroxy, lactam, phosphonic acid, or carboxylic acid group or precursor groups that can be appropriately converted, which group can be directly attached to the water-soluble reactive polymer backbone or it can be attached through a suitable divalent linking group.

For example, some useful ethylenically unsaturated polymerizable monomers from which the (c) recurring units can be derived include but are not limited to, (meth)acrylic acid, itaconic acid, maleic anhydride, fumaric acid, citraconic acid, vinyl benzoic acid, 2-carboxyethyl acrylate, 2-carboxyethyl methacrylate, (meth)acrylamide, N-vinyl pyrrolidone, 2-hydroxyethyl methacrylate, 2-aminoethyl methacrylate, vinyl phosphonic acid, N-isopropyl acrylamide, and dimethyl acrylamide.

In addition to the (a), (b), and (c) recurring units described above, the water-soluble reactive polymers can optionally comprise one or more additional recurring units that are different from all (a), (b), and (c) recurring units, and herein identified as optional (d) recurring units, in an amount of less than 40 mol %, or up to and including 30 mol %, all based on the total recurring units in the water-soluble reactive polymer. Alternatively, (d) recurring units can be present with (a) and (b) recurring units but (c) recurring units can be absent.

A skilled polymer chemist would understand how to choose such additional (d) recurring units, and for example, they can be derived from one or more ethylenically unsaturated polymerizable monomers selected from the group consisting of alkyl acrylates, alkyl methacrylates, styrene and styrene derivatives, vinyl ethers, vinyl benzoates, vinylidene halides, vinyl halides, vinyl imides, and other materials that a skilled worker in the art would understand could provide desirable properties to the water-soluble reactive polymer. Such (d) recurring units can be represented by Structure (-D-) as follows:

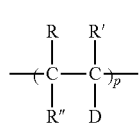

wherein the pendant D groups in Structure (-D-) can be for example, hydrogen, substituted or unsubstituted alkyl groups, substituted or unsubstituted aryl groups, alkyl ester groups, aryl ester groups, halogens, or ether groups.

In addition, some (d) recurring units can comprise an epoxy (such as a glycidyl group) or epithiopropyl group derived for example from glycidyl methacrylate or glycidyl acrylate.

In the recurring units described above, R, R', and R" can be the same or different hydrogen, methyl, ethyl, or chloro groups and each type of recurring unit can have the same or different R, R', and R" groups along the reactive polymer backbone. In most embodiments, R, R', and R" are hydrogen or methyl, and R, R', and R" can be the same or different for the various (a), (b), (c), and (d) recurring units in a given water-soluble reactive polymer.

In the Structures shown above "m," "n," and "p" are used to represent the respective molar amounts of recurring units, based on the total recurring units in a given water-soluble reactive polymer, so that the sum of m, n, and p equal 100 mol % in a given water-soluble reactive polymer.

The mol % amounts of the various recurring units defined herein for the water-soluble reactive polymers defined herein are meant to refer to the actual molar amounts present in the water-soluble reactive polymers. It is understood by one skilled in the art that the actual mol % values may differ from those theoretically possible from the amount of ethylenically unsaturated polymerizable monomers that are used in the polymerization reaction solution. However, under most polymerization conditions that allow high polymer yield and optimal reaction of all monomers, the actual mol % of each monomer is generally within ±15 mol % of the theoretical amounts.

Some representative water-soluble reactive polymer embodiments include but are not limited to, the following copolymers and terpolymers wherein the molar ratios are theoretical (nominal) amounts based on the actual molar ratio of ethylenically unsaturated polymerizable monomers used in the polymerization process. The actual molar amounts of recurring units can differ from the theoretical (nominal) amounts of monomers if the polymerization reactions are not carried out to completion.

poly(3-sulfopropyl methacrylate potassium salt-co-2-cinnamoyl-ethyl methacrylate) (80:20 mol %);
poly(3-sulfopropyl methacrylate potassium salt-co-2-cinnamoyl-ethyl methacrylate) (70:30 mol %);
poly(3-sulfopropyl methacrylate potassium salt-co-2-cinnamoyl-ethyl methacrylate) (50:50 mol %);
poly(3-sulfopropyl methacrylate potassium salt-co-methacrylic acid-co-2-cinnamoyl-ethyl methacrylate) (50:30:20 mol %);
poly(3-sulfopropyl methacrylate-co-methacrylic acid-co-2-cinnamoyl-ethyl methacrylate) (50:30:20 mol %);
poly(3-sulfopropyl methacrylate-co-methacrylic acid-co-2-cinnamoyl-ethyl methacrylate) (55:25:20 mol %);
poly(3-sulfopropyl methacrylate-co-methacrylic acid-co-2-cinnamoyl-ethyl methacrylate) (60:20:20 mol %);
poly(3-sulfopropyl methacrylate-co-methacrylic acid-co-2-cinnamoyl-ethyl methacrylate) (80:10:10 mol %);
poly(3-sulfopropyl methacrylate-co-methacrylic acid-co-2-cinnamoyl-ethyl methacrylate) (85:10:5 mol %);
poly(3-sulfopropyl methacrylate-co-methacrylic acid-co-2-cinnamoyl-ethyl methacrylate) (70:10:20 mol %);
poly(3-sulfopropyl methacrylate-co-methyl methacrylate-co-2-cinnamoyl-ethyl methacrylate) (50:30:20 mol %);
poly(3-sulfopropyl methacrylate-co-butyl methacrylate-co-2-cinnamoyl-ethyl methacrylate) (75:5:20 mol %);
poly(3-sulfopropyl methacrylate-co-styrene-co-2-cinnamoyl-ethyl methacrylate) (70:10:20 mol %);
poly(3-sulfopropyl methacrylate-co-methacrylic acid-co-butyl methacrylate-co-2-cinnamoyl-ethyl methacrylate) (70:5:5:20 mol %);
poly(3-sulfopropyl methacrylate-co-methacrylic acid-co-styrene-co-2-cinnamoyl-ethyl methacrylate) (65:10:5:20 mol %);
poly(3-sulfopropyl methacrylate potassium salt-co-acrylamide-co-2-cinnamoyl-ethyl methacrylate) (50:30:20 mol %);
poly(3-sulfopropyl methacrylate potassium salt-co-acrylamide-co-2-cinnamoyl-ethyl methacrylate) (70:10:20 mol %);
poly(3-sulfopropyl methacrylate potassium salt-co-2-hydroxyethyl metacrylate-co-2-cinnamoyl-ethyl methacrylate) (50:30:20 mol %);
poly(3-sulfopropyl methacrylate potassium salt-co-2-hydroxyethyl metacrylate-co-2-cinnamoyl-ethyl methacrylate) (70:10:20 mol %);
poly(3-sulfopropyl methacrylate potassium salt-co-maleic anhydryde-co-2-cinnamoyl-ethyl methacrylate) (50:30:20 mol %);
poly(3-sulfopropyl methacrylate potassium salt-co-maleic anhydryde-co-2-cinnamoyl-ethyl methacrylate) (70:10:20 mol %);
poly(3-sulfopropyl methacrylate potassium salt-co-N-vinyl-2-pyrrolidone-co-2-cinnamoyl-ethyl methacrylate) (50:30:20 mol %);
poly(3-sulfopropyl methacrylate potassium salt-co-vinyl phosphonic acid-co-2-cinnamoyl-ethyl methacrylate) (70:10:20 mol %);
poly(2-acylamide-2-methyl-1-propanesulfonic acid-co-2-cinnamoyl-ethyl methacrylate) (80:20 mol %);
poly(2-acylamide-2-methyl-1-propanesulfonic acid-co-methacrylic acid-co-2-cinnamoyl-ethyl methacrylate) (50:30:20 mol %);
poly(2-acylamide-2-methyl-1-propanesulfonic acid-co-methacrylic acid-co-2-cinnamoyl-ethyl methacrylate) (70:10:20 mol %);
poly(2-acylamide-2-methyl-1-propanesulfonic acid-co-acrylamide-co-2-cinnamoyl-ethyl methacrylate) (70:10:20 mol %);
poly(2-acylamide-2-methyl-1-propanesulfonic acid-co-2-hydroxyethyl methacrylate-co-2-cinnamoyl-ethyl methacrylate) (70:10:20 mol %);

poly(2-acylamide-2-methyl-1-propanesulfonic acid-co-maleic anhydryde-co-2-cinnamoyl-ethyl methacrylate) (70:10:20 mol %);

poly(2-acylamide-2-methyl-1-propanesulfonic acid-co-N-vinyl-2-pyrrolidone-co-2-cinnamoyl-ethyl methacrylate) (70:10:20 mol %);

poly(2-acylamide-2-methyl-1-propanesulfonic acid-co-vinyl phosphonic acid-co-2-cimmmoyl-ethyl methacrylate) (70:10:20 mol %);

poly(styrene sulfonic acid sodium salt-co-2-cinnamoylethyl methacrylate) (80:20 mol %);

poly(styrene sulfonic acid sodium salt-co-methacrylic acid-co-2-cinnamoylethyl methacrylate) (50:30:20 mol %);

poly(styrene sulfonic acid sodium salt-co-methacrylic acid-co-2-cinnamoylethyl methacrylate) (70:10:20 mol %);

poly(2-sulfoethyl methacrylate sodium salt-co-methacrylic acid-co-2-cinnamoylethyl methacrylate) (70:10:20 mol %);

poly(4-sulfobutyl methacrylate sodium salt-co-methacrylic acid-co-2-cinnamoylethyl methacrylate) (70:10:20 mol %);

poly(3-sulfopropyl methacrylate potassium salt-co-7-(2-methacryloxyethoxy)-4-methylcoumarin) (80:20 mol %);

poly(3-sulfopropyl methacrylate potassium salt-co-methacrylic acid-co-7-(2-methacryloxyethoxy)-4-methylcoumarin) (50:30:20 mol %);

poly(3-sulfopropyl methacrylate potassium salt-co-methacrylic acid-co-7-(2-methacryloxyethoxy)-4-methylcoumarin) (40:40:20 mol %);

poly(3-sulfopropyl methacrylate potassium salt-co-methacrylic acid-co-7-(2-methacryloxyethoxy)-4-methylcoumarin) (70:10:20 mol %);

poly(styrene sulfonic acid sodium salt-co-acrylic acid-co-7-(2-methacryloxyethoxy)-4-methylcoumarin) (70:10:20 mol %);

poly(styrene sulfonic acid sodium salt-co-acrylamide-co-7-(2-methacryloxyethoxy)-4-methylcoumarin) (70:10:20 mol %);

poly(styrene sulfonic acid sodium salt-co-2-hydroxyethyl methacrylate-co-7-(2-methacryloxyethoxy)-4-methylcoumarin) (70:10:20 mol %);

poly(styrene sulfonic acid sodium salt-co-maleic anhydryde-co-7-(2-methacryloxyethoxy)-4-methylcoumarin) (70:10:20 mol %);

poly(styrene sulfonic acid sodium salt-co-N-vinyl-2-pyrrolidone-co-7-(2-methacryloxyethoxy)-4-methylcoumarin) (70:10:20 mol %);

poly(styrene sulfonic acid sodium salt-co-vinyl phosphonic acid-co-7-(2-methacryloxyethoxy)-4-methylcoumarin) (70:10:20 mol %);

poly(styrene sulfonic acid sodium salt-co-N-vinyl-2-pyrrolidone-co-methacrylic acid-co-7-(2-methacryloxyethoxy)-4-methylcoumarin) (70:5:5:20 mol %);

poly(styrene sulfonic acid sodium salt-co-7-(2-methacryloxyethoxy)-4-methylcoumarin) (80:20 mol %);

poly(styrene sulfonic acid sodium salt-co-7-(2-methacryloxyethoxy)-4-methylcoumarin) (70:30 mol %);

poly(styrene sulfonic acid sodium salt-co-7-(2-methacryloxyethoxy)-4-methylcoumarin) (60:40 mol %);

poly(styrene sulfonic acid sodium salt-co-7-(2-methacryloxyethoxy)-4-methylcoumarin) (50:50 mol %);

poly(styrene sulfonic acid sodium salt-co-methacrylic acid-co-7-(2-methacryloxyethoxy)-4-methylcoumarin) (50:30:20 mol %);

poly(styrene sulfonic acid sodium salt-co-methacrylic acid-co-7-(2-methacryloxyethoxy)-4-methylcoumarin) (60:20:20 mol %);

poly(styrene sulfonic acid sodium salt-co-methacrylic acid-co-7-(2-methacryloxyethoxy)-4-methylcoumarin) (70:10:20 mol %);

poly(styrene sulfonic acid sodium salt-co-methacrylic acid-co-7-(2-methacryloxyethoxy)-4-methylcoumarin) (75:5:20 mol %);

poly(styrene sulfonic acid sodium salt-co-methacrylic acid-co-7-(2-methacryloxyethoxy)-4-methylcoumarin) (78:2:20 mol %);

poly(styrene sulfonic acid sodium salt-co-methacrylic acid-co-7-(2-methacryloxyethoxy)-4-methylcoumarin) (85:5:10 mol %);

poly(2-acylamide-2-methyl-1-propanesulfonic acid-co-7-(2-methacryloxyethoxy)-4-methylcoumarin) (80:20 mol %);

poly(styrene sulfonic acid sodium salt -co-N-(2-(methacryloxy)ethyl)dimethylmaleimide-) (80:20 mol %);

poly(2-acylamide-2-methyl-1-propanesulfonic acid-co-methacrylic acid-co-7-(2-methacryloxyethoxy)-4-methylcoumarin) (50:30:20 mol %);

poly(3-sulfopropyl methacrylate-co-N-(2-(methacryloxy)ethyl)dimethylmaleimide-) (80:20 mol %);

poly(3-sulfopropyl methacrylate-co-methacrylic acid-co-N-(2-(methacryloxy)ethyl)dimethylmaleimide-) (50:30:20 mol %);

poly(3-sulfopropyl methacrylate-co-methacrylic acid-co-N-(2-(methacryloxy)ethyl)dimethylmaleimide-) (70:10:20 mol %);

poly(styrene sulfonic acid sodium salt-co-methacrylic acid-co-N-(2-(methacryloxy)ethyl)dimethylmaleimide-) (50:30:20 mol %);

poly(2-acylamide-2-methyl-1-propanesulfonic acid-co-methacrylic acid-co-N-(2-(methacryloxy)ethyl)dimethylmaleimide-) (50:30:20 mol %);

poly[3-sulfopropyl methacrylate-co-3N-(2-(methacryloxy)ethyl-thymine] (80:20 mol %);

poly[3-sulfopropyl methacrylate-co-methacrylic acid-co-3N-(2-(methacryloxy)ethyl-thymine] (50:30:20 mol %);

poly(3-sulfopropyl methacrylate sodium salt-co-methacrylic acid-co-2-(2,3-diphenyl-2-cyclopropene-1-carbonyloxy)ethyl methacrylate) (50:30:20 mol %);

poly(3-sulfopropyl methacrylate sodium salt-co-methacrylic acid-co-2-(2,3-diphenyl-2-cyclopropene-1-carbonyloxy)ethyl methacrylate) (70:10:20 mol %);

poly(2-acrylamindo-2-methyl-1-propanesulfonic acid -co-methacrylic acid-co-2-(2,3-diphenyl-2-cyclopropene-1-carbonyloxy)ethyl methacrylate) (70:10:20 mol %);

poly(styrene sulfonic acid sodium salt-co-methacrylic acid-co-2-(2,3-diphenyl-2-cyclopropene-1-carbonyloxy)ethyl methacrylate) (70:10:20 mol %);

poly[3-sulfopropyl methacrylate-co-1-methyl-4-[2-(4-(2-methacryloxyethyl)-carbonyloxyphenyl)ethenyl]pyridinium trifluoromethylsulfonate] (80:20 mol %);

poly[styrene sulfonic acid sodium salt-co-1-methyl-4-[2-(4-(2-methacryloxyethyl)-carbonyloxyphenyl)ethenyl]pyridinium trifluoromethylsulfonate] (80:20 mol %);

poly[3-sulfopropyl methacrylate-co-methacrylic acid-co-1-methyl-4-[2-(4-(2-methacryloxyethyl)-carbonyloxyphenyl)ethenyl]pyridinium trifluoromethylsulfonate] (40:40:20 mol %);

poly[styrene sulfonic acid sodium salt-co-methacrylic acid-co-1-methyl-4-[2-(4-(2-methacryloxyethyl)-carbonyloxyphenyl)ethenyl]quinolinium trifluoromethylsulfonate] (70:10:20 mol %);

poly[styrene sulfonic acid sodium salt-co-methacrylic acid-co-1-methyl-2-[2-(4-(2-methacryloxyethyl)-carbonyloxyphenyl)ethenyl]thiazolium trifluoromethylsulfonate-co-methacrylic acid] (70:10:20 mol %);

poly[styrene sulfonic acid-co-methacrylic acid-co-1-methyl-4-[2-(4-(2-methacryloxyethyl)-carbonyloxyphenyl)ethenyl]pyridine](70:10:20 mol %); and poly[styrene sulfonic acid sodium salt-co-2-(4-(2-methacryloxyethyl)-carbonyloxyphenyl)ethenyl]phenyl] (80:20 mol ).

The water-soluble reactive polymers useful in the invention generally have a molecular weight ($M_w$) of at least 10,000 and up to and including 1,000,000, or less than 100,000 for some uses, and at least 100,000 and up to and including 500,000 for other uses, all values being measured by gel permeation chromatography (GPC) or by size exclusion chromatography (SEC).

Preparation of the water-soluble reactive polymers useful in the present invention can be accomplished by free radical initiated polymerization in the appropriate reaction solvent combination. The proper choice of reaction solvents is desirable for successful polymerization because of the wide disparity in polarity between the various ethylenically unsaturated polymerizable monomers with the ethylenically unsaturated polymerizable monomers providing the (a) recurring units being very polar or negatively charged and water soluble and the ethylenically unsaturated polymerizable monomers that provide (b) recurring units being relatively non-polar and hydrophobic. It is typical to require up to three reaction solvents in combination to facilitate a well-controlled polymerization. Useful reaction solvents include but are not limited to, water, ketones such as methyl ethyl ketone (2-butanone), aprotic polar solvents such as N,N-dimethylacetamide, and alcohols such as isopropyl alcohol. Readily available free radical initiators such as 2,2'-azodi(2-methylbutyronitrile) (AMBN) or azobis(isobutyronitrile) (AIBN) generally work well in these preparations of the reaction polymers. The polymerization reaction is typically carried out at 60° C. to 75° C. for about 18 hours. Controlled or living radical polymerization methods (see for example, Qui et al., *Progress in Polymer Science* 26 (2001) 2083-2134) that can produce very narrow molecular weight distributions and highly controlled block copolymers could also be used.

Purification of useful water-soluble reactive polymers is best accomplished by dialysis because of their high water solubility. Additional water can be added to the completed reaction mixture that is then placed in a dialysis bag with a typical retention of polymer chains with an $M_w$ of 3500 Daltons or more. The dialysis bag containing the crude water-soluble reactive polymer is placed in a water washing bath for 1 to 2 days or longer if needed. After dialysis, the dilute water-soluble reactive polymer solution can be concentrated by evaporation to about 10 weight to 30 weight % solids which is suitable for storage and dilution to desired coating concentrations containing surfactants or humectants.

Photocurable Compositions

The water-soluble reactive polymers described herein can be incorporated into various photocurable compositions described below. Such photocurable compositions can be incorporated into the various articles described below or used in various methods as described below.

Each photocurable composition described herein has only one essential component, that is, one or more water-soluble reactive polymers as described above. The water-soluble reactive polymers can be used to form crosslinked reacted polymers (rendered water-insoluble) upon exposure to radiation having $\lambda_{max}$ of at least 150 nm and up to and including 700 nm, at least 150 nm and up to and including 450 nm, or of at least 250 nm and up to and including 450 nm, as described below. While various other optional components can be included as described below, only the water-soluble reactive polymer is essential for providing the desired articles and use in the methods.

One or more water-soluble reactive polymers can be present in the photocurable composition in an amount of at least 50 weight % and up to and including 100 weight %, or at least 70 weight % and up to and including 95 weight %, based on the total solids in the photocurable composition.

The photocurable compositions generally do not include separate crosslinking agents or crosslinking agent precursors because the water-soluble reactive polymer itself includes sufficient crosslinkable groups (described above). However, as noted above, if present, some (d) recurring units can also include additional crosslinking groups.

While not essential, it is sometimes desirable to enhance the sensitivity of some water-soluble reactive polymers to longer wavelengths by including one or more photosensitizers including triplet state photosensitizers. A variety of photosensitizers are known in the art such as benzothiazole and naphthothiazole compounds as described in U.S. Pat. No. 2,732,301 (Robertson et al.), aromatic ketones as described in U.S. Pat. No. 4,507,497 (Reilly, Jr.), and ketocoumarins, as described for example in U.S. Pat. No. 4,147,552 (Specht et al.) and U.S. Pat. No. 5,455,143 (Ali), the disclosures of all of which are incorporated herein by reference. Particularly useful photosensitizers for long UV and visible light sensitivity include but are not limited to, 2-[bis(2-furoyl)methylene]-1-methyl-naphtho[1,2-d]thiazoline, 2-benzoylmethylene-1-methyl-β-naphthothiazoline, 3,3'-carbonylbis(5,7-diethoxycoumarin), 3-(7-methoxy-3-coumarinoyl)-1-methylpyridinium fluorosulfate, 3-(7-methoxy-3-coumarinoyl)-1-methylpyridinium 4-toluenesulfonic acid, and 3-(7-methoxy-3-coumarinoyl)-1-methylpyridinium tetrafluoroborate. Other useful compounds are described in Columns 6 and 7 of U.S. Pat. No. 4,147,552 (noted above) which compound disclosure is incorporated herein by reference. Thioxanthones are also particularly useful for sensitizing the type (iv) [2+2] photocycloaddition groups such as dimethylmaleimide.

One or more photosensitizers can be present in a photocurable composition (and resulting dry layer) in an amount of at least 0.1 weight % and up to and including 10 weight %, or more likely at least 0.5 weight % and up to and including 5 weight %, based on the total solids in the photocurable composition (or total dry weight of the photocurable composition).

The photocurable compositions described herein can individually and optionally include one or more addenda such as film-forming compounds, surfactants (such as nonionic surfactants in an amount of up to 1 weight % based on total solids), humectants, plasticizers, filter dyes, viscosity modifiers, and any other optional components that would be readily apparent to one skilled in the art, and such addenda can be present in amounts that would also be readily apparent to one skilled in the art, depending upon the means that is used to dispose the photocurable composition onto a substrate.

In some embodiments, the photocurable compositions comprise one or more carbon-containing materials such as carbon nanotubes, graphene, graphite, carbon black, or other conductive carbon-containing materials, in an amount of at least 0.1 weight %, or at least 0.5 weight % and up to and including 20 weight %, based on the total solids in the photocurable composition. Such materials can be obtained from various commercial sources.

Moreover, the photocurable composition can also include conductive forms of carbon such as graphene, carbon nanotubes, and carbon-coated metal particles such as carbon-coated silver particles or carbon-coated copper particles, examples of which can be obtained from various commercial sources. Such materials can be present in an amount of at least 0.1 weight % and up to and including 50 weight %, based on the total solids of the photocurable composition.

The essential water-soluble reactive polymer and any optional materials described above, are generally dissolved or dispersed in water or a mixture of water and water-miscible organic solvents to form a photocurable composition that can be applied to a suitable substrate (described below) in a suitable manner. Useful water-miscible organic solvents include but are not limited to, alcohols such as methanol, ethanol, and isopropanol and polyols such as ethylene glycol, propylene glycol, and glycerol. The amounts of the water-soluble reactive polymer and any optional compounds in the photocurable compositions can be readily determined by a skilled artisan for desired use in coating. Typically, the water-soluble reactive polymer and any optional materials comprise at least 5 weight % and up to and including 50 weight % of the total photocurable composition, the remainder being the solvent(s) medium used for application.

Articles

The water-soluble reactive polymers in photocurable compositions described above can be used to prepare a variety of precursor articles that can be used for various purposes as described above, for example for preparing electrically-conductive elements (or articles).

In all of these precursor articles, a photocurable composition can be disposed in a suitable manner onto one or multiple surfaces (supporting surfaces or supporting sides) of a suitable substrate. For example, any of the photocurable compositions described above can be applied to a suitable substrate using any suitable method including but not limited to, spin coating, screen printing, bead coating, blade coating, curtain coating, or spray coating, inkjet printing, gravure printing, flexographic printing, or lithographic printing, from a suitable reservoir to form either a uniform layer or desired pattern of the photocurable composition containing one or more water-soluble reactive polymers.

Useful substrates can be chosen for a particular use or method as long as the substrate material will not be degraded by the photocurable composition or any treatments to which the resulting articles are subjected during the method of this invention. The photocurable composition can be applied multiple times if desired to obtain a thicker coating of a layer or pattern, and dried between each coating or dried only after the last application. Water and any water-miscible organic solvents can be removed from the photocurable composition using any suitable drying technique.

In general, the final dry layer or pattern of any photocurable composition can have an average dry thickness of at least 10 nm and up to and including 1 mm, with a dry thickness of at least 0.1 μm and up to and including 100 μm being useful for various uses. Such layers can be uniformly disposed on a substrate surface or applied in a suitable patternwise fashion as described below.

Useful substrates can be composed of glass, quartz, and ceramics as well as a wide variety of flexible materials such as cellulosic papers and polymeric films composed of polyesters including poly(ethylene terephthalate) and poly(ethylene naphthalate), polycarbonates, polyamides, poly(meth)acrylates, or polyolefins. Useful polymeric substrates can be formed by casting or extrusion methods. Laminates of various substrate materials can also be put together to form a composite substrate. Any of the substrates can be treated to improve adhesion using for example corona discharge, oxygen plasma, ozone or chemical treatments using silane compounds such as aminopropyltriethoxysilane. The substrates can be of any suitable dry thickness including but not limited to at least 10 μm and up to and including 10 mm, depending upon the intended use of the resulting articles.

Particularly useful substrates are flexible transparent polymeric substrates that are composed of poly(ethylene terephthalate) such as biaxially oriented poly(ethylene terephthalate) (PET) films. These PET films, ranging in dry thickness of at least 50 μm and up to and including 200 μm, can also comprise, on at least one supporting side, a polymeric primer layer (also known as a subbing layer, adhesive layer, or binder layer) that can be added prior to or after film stretching. Such polymeric primer layers can comprise poly(acrylonitrile-co-vinylidene chloride-co-acrylic acid), poly(methyl acrylate-co-vinylidene chloride-co-itaconic acid), poly(glycidyl methacrylate-co-butyl acrylate), or various water-dispersible polyesters, water-dispersible polyurethanes, or water-dispersible polyacrylics, as well as sub-micrometer silica particles. The dry thickness of the primer layer can be at least 0.1 μm and up to and including 1μμm.

In many embodiments of the present invention, each of the substrates has an integrated transmittance of at least 80%, or at least 90% or even higher to provide articles that exhibit excellent transparency. Such highly transparent substrates can be composed of glass (such as flexible glass) or polymeric films (such as polyester films) as described above.

The useful substrates can be in any suitable shape or size. They can be in the form of sheets, films, tubes, particles, or various 3-dimensional shapes depending upon the intended use. Some particularly useful substrates are in the form of continuous flexible polymeric webs that can be unrolled from a stock roll, treated in a suitable manner for example to apply a photocurable composition followed by various treatments (described below) and then rolled up in roll form for shipment or later use in roll-to-roll manufacturing processes. For example, the substrate can be provided in the form of a roll of a continuous polymeric web such as a roll of a continuous polyester web.

If a substrate is in the form of a sheet or roll, it typically has two opposing planar surfaces known herein as a "supporting side" (or supporting planar surface) and an "opposing supporting side" (or opposing supporting planar surface). A photocurable composition can be disposed in a suitable manner uniformly or patternwise on one or both supporting sides of the substrate using the same or different photocurable compositions.

In some embodiments, a precursor article can be prepared with a substrate by providing a uniform layer of a photocurable composition on a supporting side of the substrate, for example, uniformly on one or both supporting sides of a continuous polyester web using any suitable coating means that is well known in the art.

In other embodiments, a pattern of a photocurable composition can be provided on one or both supporting sides of the substrate using a suitable "imaging" means such as inkjet printing, flexographic printing, lithographic printing, gravure printing, or screen printing. The procedures and equipment needed for such application are well known in the art.

Methods of Providing Electrically-conductive PANI Patterns

Once the photocurable composition has been disposed upon one or both supporting sides of the substrate, the photocurable composition is exposed to radiation sufficient to cause crosslinking via [2+2] photocycloaddition of the (b) recurring units, thereby forming a crosslinked polymer on one or more supporting sides of the substrate. Either uniform or patternwise (imagewise) exposure can be carried out in a similar manner.

For example, exposure can be carried out using radiation having a $\lambda_{max}$ of at least 150 nm and up to and including 700 nm or to radiation having a $\lambda_{max}$ of at least 200 nm and up to and including 450 nm. This exposure can be provided with any suitable exposing source or device that provides the desired radiation including but not limited to, various arc lamps and LED sources. The particular exposing source can be chosen depending upon the absorption characteristics of the photocurable composition used. The exposing radiation can be projected through lenses and mirrors or through a lens or mask element that can be in physical contact or in proximity with a water-soluble complex. Exposure time can range from a fraction (0.1) of a second and up to and including 10 minutes depending upon the intensity of the radiation source and the water-soluble reactive polymer used in the photocurable composition. Suitable masks can be obtained by known methods including but not limited to photolithographic methods, flexographic methods, or vacuum deposition of a chrome mask onto a suitable substrate such as quartz or high quality optical glass followed by photolithographic patterning.

Such exposure can be carried out in the same or different manner on each of the supporting sides of the substrate and for one or multiple patterns of photocurable composition. Typically, any non-crosslinked, water-soluble reactive polymer (for example, within the photocurable composition) can be removed from the one or more supporting sides of the substrate so that there is essentially none (or less than 10%, and particularly less than 5%, by weight of the original amount) remaining on the substrate. This can be done by washing, spraying, or immersing the article in water, aqueous alkaline solution, or another aqueous solution for a suitable time and temperature to remove most or all water-soluble reactive polymer from the substrate. Contact with the aqueous solution can be carried out for a suitable time and temperature so that water-soluble reactive polymer is desirably removed in the non-exposed regions but little removal occurs in the exposed regions containing the crosslinked polymer. For example, the contact time can be at least 10 seconds and up to and including 10 minutes, and the contact temperature can be at room temperature (about 20° C.) and up to and including 95° C.

Whether in the form of a uniform layer or pattern, the crosslinked polymer is contacted with an aniline reactive composition in order to form electrically-conductive polyaniline disposed within, on top of, or both within and on top of, the crosslinked polymer. Significantly no electrically-conductive polyaniline is formed elsewhere, for example on bare substrate or on any remaining water-soluble reactive polymer. By "significantly no electrically-conductive polyaniline", it is meant that at least 95 weight % or even at least 99 weight %, of the formed electrically-conductive polyaniline is disposed within, on top of, or both within and on top of, the crosslinked polymer on the substrate.

The polymerization of aniline is an oxidative process and the "polymerization bath" or aniline reactive composition must include one or more oxidizing agents. Thus, the noted aniline reactive composition comprises two essential components: (1) an aniline monomer in an amount of at least 0.01 molar or even at least 0.025 molar and up to and including 1 molar; and (2) at least 0.01 molar of an aniline oxidizing agent, that refers to a compound that can remove one or more electrons from the aniline molecules or polymers to form reactive radicals that can react with additional aniline to form and grow the polyaniline. Useful aniline oxidizing agents include but are not limited to, persulfate (such as potassium persulfate and ammonium persulfate), ozone, a peroxide (such as hydrogen peroxide), oxygen present in air, and other compounds that would be readily apparent to one skilled in the art. The choice of aniline oxidizing agents can also depend upon the presence of catalysts such as ferric or cupric ions. Mixtures of aniline oxidizing agents can be used if desired. The one or more aniline oxidizing agents are present in the aniline reactive composition in an amount of at least 0.01 molar and up to and including 1 molar, or even at least 0.025 molar and up to and including 0.5 molar.

In some embodiments, the aniline reactive composition is acidic in pH and this can be accomplished by adding hydrochloric acid or sulfuric acid in an amount to obtain the desired pH.

When a persulfate is used as the aniline oxidizing agent, it can be added within about 5 minutes of using the aniline reactive composition. Higher concentrations can be used to achieve shorter polymerization times but this should be balanced with the stability of the aniline reactive composition.

It can be important to balance the amount of aniline monomer and the aniline oxidizing agent in the aniline reactive composition to control the degree of polymerization and formation of polyaniline. For example, the molar ratio of aniline monomer to the aniline oxidizing agent is from 1:0.5 to and including 1:1.5, or more likely from 1:0.75 to and including 1:1.25. A molar ratio greater than 1:1 can cause over oxidation that will decrease or eliminate the electrical conductivity of the polyaniline. Molar ratios below 1:0.5 will provide insufficient polyaniline for eventual use in various devices.

Formation of polyaniline within, on top of, or both within and on top of, the crosslinked polymer can be carried out at any suitable temperature from below room temperature (about 0° C.) up to and including 90° C., for a suitable time of at least 0.5 minute and up to and including 100 minutes. Higher temperatures will quicken polymerization.

After polyaniline formation, the article containing the uniform layer or pattern of polyaniline can be removed from the aniline reactive composition and washed in water for up to 5 minutes to remove any remaining aniline monomer and aniline oxidizing agent. The polyaniline layer or pattern can be suitably dried and is found to be electrically-conductive due to the inherent acid doping provided by the sulfonic acid or sulfonate groups in the crosslinked polymer.

In some embodiments, it is useful to contact the crosslinked polymers with a metal ion catalyst for aniline oxidation. This can be done prior to contacting the crosslinked polymer with the aniline reactive composition, or simultaneously therewith. Times for forming electrically-conductive polyaniline can be reduced by the contacting the crosslinked polymer with the metal ion catalyst before contact with the aniline reactive composition. Along with the shorter polymerization times achieved with such embodiments, a significant reduction in the formation of polyaniline outside of the crosslinked polymer is also improved. Ferric ($Fe^{+3}$) ion is particularly effective metal ion catalyst for aniline oxidation and it can be contacted with the crosslinked polymer coatings or patterns by simply immersing them in a ferric sulfate bath of typically 1 molar or less for less than 10 minutes, typically from 1 or 2 minutes, and then rinsing the crosslinked polymer treated in this manner with water before immersing contacting it with the aniline reactive composition. The formation of polyaniline within, on top of, or both within and on top of, the crosslinked polymer coatings or patterns containing ferric ion will occur in 50% or less of the polymerization time without the ferric ions for a given polymerization bath and reaction temperature with no detectable polyaniline formation outside of the crosslinked polymer. Other useful metal ion catalysts for aniline oxidation besides ferric ion can be used, including but not limited to, copper, silver, nickel, and cobalt ions depending on the aniline oxidizing agent used in the aniline reactive composition. For example, copper (II) ion can be used as a metal ion catalyst for aniline oxidation when a peroxide or ozone is used for the aniline oxidation agent.

Ferric ions or another metal ion catalyst can be used in a solution containing at least 0.1 molar metal ions, or even at least 0.5 molar metal ions and up to and including 1 molar metal ions.

For some embodiments, the method according to this invention can further comprise:

contacting the crosslinked polymer with the metal ion catalyst for aniline oxidation as described above,
rinsing the crosslinked polymer, and
contacting the crosslinked polymer with the aniline reaction composition as described above.

One useful method of this invention uses multiple flexographic printing plates (for example, prepared as described above) in a printing station wherein each stack of flexographic printing plates has its own printing plate cylinder so that each flexographic printing plate is used to print individual substrates, or the stack of printing plates can be used to print multiple portions of photocurable composition in a single continuous web (on one or both opposing supporting sides). The same or different photocurable composition can be "printed" or applied to a substrate (on same or opposing supporting sides) using the multiple flexographic printing plates.

In other embodiments, a central impression cylinder can be used with a single impression cylinder mounted on a printing press frame. As the substrate (or receiver element) enters the printing press frame, it is brought into contact with the impression cylinder and the appropriate photocurable composition pattern is printed or formed on one or both supporting sides of the substrate. Alternatively, an "in-line" flexographic printing process can be utilized in which the printing stations are arranged in a horizontal line and are driven by a common line shaft. The printing stations can be coupled to exposure stations, cutting stations, folders, aniline reaction polymerization baths, and any other useful continuous processing stations or equipment. A skilled worker could readily determine other useful configurations of equipment and stations using information that is available in the art. For example, an in-the-round imaging process is described in WO 2013/063084 (Jin et al.).

Thus, in some embodiments of the method for providing a product article of this invention, the method comprises:

providing a continuous web of a transparent substrate of any of those materials described above, but particularly transparent polymeric substrates (such as polyesters films),
forming a first photocurable composition pattern from a photocurable composition as described herein, on at least a first portion of the continuous web, for example using a flexographic printing member,
exposing the first photocurable composition pattern to radiation (as described above) to form a first photocured, crosslinked polymer pattern on the first portion,
contacting the first photocured, crosslinked polymer pattern on the first portion with an aniline reactive composition as described above to form polyaniline within, on top of, or both within and on top of, the first crosslinked polymer pattern using procedures described above.

Embodiments of this method can be carried out on a single supporting side of the substrate, or on opposing supporting sides of the substrate to provide the same or different patterns of polyaniline.

As would be apparent to one skilled in the art, a plurality of portions having the same or different patterns of polyaniline can be provided on a continuous (for example, polyester) web (on one or both opposing supporting sides) according to the present invention.

Alternatively, a method of this invention can be used to provide a plurality of precursor articles, the method comprising:

providing a continuous web of a transparent substrate (such as a continuous web of a transparent polyester) as described above,
forming a first pattern of photocurable composition on a first portion of the continuous web by applying a photocurable composition to the first portion using a flexographic printing member as described above or by ink jet printing,
advancing the continuous web comprising the first portion comprising the first photocurable composition pattern to be proximate (sufficiently close to) exposing radiation and thereby forming a first photocured crosslinked polymer pattern on the first portion,
forming a second pattern of a photocurable composition on a second portion of the continuous web by applying the same or different photocurable composition to the second portion using the same or different flexographic printing member or ink jet printing,
advancing the continuous web comprising the second portion comprising the second photocurable composition pattern to be proximate (sufficiently close to) exposing radiation and thereby forming a second photocured crosslinked polymer pattern on the second portion,
optionally, carrying out the above noted features one or more times on additional portions of the continuous web using the same or different photocurable compositions and the same or different flexographic printing member, or ink jet printing processes and printers, to form additional crosslinked polymer patterns on the additional portions, and
winding up the continuous web comprising multiple crosslinked polymer patterns.

As would be apparent from other teaching in this disclosure, such method embodiments can be carried out on opposing supporting sides of the continuous web to provide same or different crosslinked polymer patterns on those opposing supporting sides.

In still other embodiments, a method of this invention can be used to provide a plurality of electrically-conductive polyaniline patterns, and comprises:

providing a continuous web comprising multiple crosslinked polymer patterns in respective portions, each crosslinked polymer pattern being provided by irradiation of a photocurable composition as described above,
treating the continuous web comprising multiple crosslinked polymer patterns with an aniline reactive composition to provide multiple electrically-conductive polyaniline patterns on the continuous web corresponding to the respective crosslinked polymer portions on the continuous web.

This method can be taken further by:

forming individual electrically-conductive articles from the multiple electrically-conductive polyaniline patterns, and assembling the individual electrically-conductive articles into the same or different devices.

Such method embodiments can be carried out on one or both opposing supporting sides of the substrate (continuous web) using the same or different photocurable compositions and reactive aniline compositions.

Useful product articles prepared according to the present invention can be formulated into chemical sensors, conductive layers in a battery, capacitor or supercapacitor structures, photovoltaics, and capacitive touch screen sensors that comprise suitable electrically-conductive grid lines, electrodes, electrical leads (tails), and electrical connectors. For example, the electrodes and tail can be formed by multiple printings of a photocurable composition described herein and forming polyaniline patterns thereon. The electrodes can form an x-y grid that enables the recognition of the point at which the user has interacted with the sensor. For example, the grid can have 16×9 conductive lines or more and a size range of for example, from 2.5 mm by 2.5 mm to 2.1 m by 2.1 m. Top electrodes in the product article can correspond to the Y axis and can be provided on a first supporting side of the substrate and bottom electrodes are electrically-conductive lines corresponding to the X axis that can be provided on the opposing supporting side of the substrate.

Some details of useful continuous roll-to-roll methods and apparatus for carrying out the present invention are described for example in U.S. Patent Application Publications 2013/0071356 (Petcavich) and 2013/0125596 (Ramakrishnan et al.). Other details of a useful manufacturing system for preparing conductive articles especially in a roll-to-roll manner are provided in WO 2014/070131 (Petcavich et al.).

An additional system of equipment and step features that can be used in carrying out the present invention is described in U.S. Patent Application Publication. 2015/091006 (Shifley), the disclosure of which is incorporated herein by reference.

Product articles provided by the methods according to this invention can have various forms and arrangements of electrically-conductive polyaniline patterns.

As one skilled in the art should appreciate, the individual treatment features or steps described above for these methods can be carried out two or more times before proceeding to the next procedure or step. For example, multiple treatments with a metal ion catalyst, and multiple contacting with the aniline reactive composition can be carried out in sequence, using the same or different conditions and solutions. Sequential washing or rinsing steps can also be carried out where appropriate.

The following Examples are provided to illustrate the practice of this invention and are not meant to be limiting in any manner.

Water-soluble reactive polymers useful in the present invention were prepared using the synthetic processes described as follows, using ethylenically unsaturated polymerizable monomers described below.

Synthesis of 7-(2-Methacryloyloxyethoxy)-4-methylcoumarin Monomer:

15.3 g of 4-methylumbelliferone (7-hydroxy-4-methylcourmarin) were dissolved in about 300 ml of dimethylacetamide (DMA) in a 3-neck 1-liter flask equipped with an overhead stirrer. Then, 48 g of potassium carbonate, 20.8 g of 2-((methylsulfonyl)oxy)ethyl methacrylate prepared from 2-hydroxyethyl methacrylate using standard procedures, and 1.66 g of potassium iodide where then added to the flask and the resulting mixture was heated in an oil bath at 70° C. about 18 hours. Thin layer chromatography indicated when the reaction was complete. The reaction mixture was cooled, poured into about 1 liter of water, and stirred for about an hour. The resulting precipitate was filtered, rinsed with another 1 liter of water, rinsed with heptane, and dried on the filter. The monomer product was confirmed by NMR. A portion of the product was further purified by silica gel chromatography with ethyl acetate. The ethyl acetate was removed by evaporation and the product was crystallized from heptane to obtain a white powder.

Synthesis of 2-Cinnamoyl-ethyl methacrylate Monomer:

Into a 500 ml, 3 neck round-bottomed flask equipped with a condenser and magnetic stir bar, were placed 2-hydroxyethyl methacrylate, (11.30 g, 0.0868 mole) ($M_w$ of 130.14 g/mole), dichloromethane (DCM) (60 g), and triethylamine ($M_w$ of 101.19g/mole) (8.50 g, 0.084 mole). The reaction mixture was stirred until a homogenous solution was obtained and placed into an ice bath. A solution of cinnamoyl chloride ($M_w$ of 166.6 g/mole) (13.33 g, 0.080 mole) dissolved in 30 g of DCM was added dropwise over 15 minutes. After this addition, the reaction solution was allowed to come to room temperature, placed into an oil bath at 40° C., and refluxed for 60 minutes to complete the reaction. The reaction solution was then cooled and removed from the oil bath and the amine hydrochloride precipitate formed during the reaction was filter off. Additional DCM was added, the reaction solution was placed in a separatory funnel, and the filtered solution was washed twice with sodium bicarbonate, twice with distilled water, once with dilute hydrochloric acid solution, and twice with distilled water. The organic layer was placed over magnesium sulfate for 30 minutes and filtered.

The DCM was removed by a rotovap and the remaining monomer product was placed under high vacuum at room temperature overnight to remove any residual DCM. The final product was a clear oil with a yellow tint having an $M_w$ of 260.29 g/mole. Purity was verified by NMR.

Preparation of Inventive Water-soluble Reactive Polymer A from Styrene Sulfonic Acid Sodium Salt and 7-(2-Methacryloyloxyethoxy)-4-methylcoumarin in a 80:20 mol % Ratio:

6.15 g of styrene sulfonic acid sodium salt and 2.15 g of 7-(2-methacryloyloxyethoxy)-4-methylcoumarin monomers were weighed out in a 100 ml single neck round-bottom flask dissolved in a solvent mixture of 11 g water, 11 g of dimethylacetamide (DMA), and 8.25 g of isopropyl alcohol. 0.08 g of AMBN initiator was added and nitrogen was bubbled through the slurry for 30 minutes before heating it in an oil bath at 65° C. for about 18 hours. The reaction mixture was cooled and diluted with water to form a clear solution. The reaction solution was dialyzed for about 18 hours and then concentrated to a 13.06 weight % solids solution that was suitable for application to a substrate. The weight average molecular weight ($M_w$) of the resulting water-soluble reactive polymer was 258,000 as determined by size exclusion chromatography (SEC).

Preparation of Inventive Water-soluble Reactive Polymer B from Styrene Sulfonic Acid Sodium Salt, Methacrylic Acid, and 7-(2-Methacryloyloxyethoxy)-4-methylcoumarin in a 70:10:20 mol % Ratio:

5.0 g of styrene sulfonic acid sodium salt, 0.3 g of methacrylic acid, and 2.0 g of 7-(2-methacryloyloxyethoxy)-4-methylcoumarin were weighed out into a 250 ml single neck round-bottom flask dissolved in a solvent mixture of 10 g water, 10 g of dimethylacetamide (DMA), and 10 g of isopropyl alcohol. 0.07 g of 2,2'-azodi(2-methylbutyronitrile) AMBN initiator was added and nitrogen was bubbled through the slurry for 60 minutes before heating in an oil bath at 65° C. for about 18 hours. The reaction mixture was cooled and diluted with water to form a clear reaction solution. The reaction solution was dialyzed for about 18 hours and then concentrated to a 15.36 weight % solids solution that was suitable for application to a substrate. The weight average molecular weight ($M_w$) of the resulting water-soluble reactive polymer was 236,000 as determined by size exclusion chromatography (SEC).

Preparation of Inventive Water-soluble Reaction Polymer C from Styrene Sulfonic Acid Sodium Salt, Methacrylic Acid, and 7-(2-Methacryloyloxyethoxy)-4-methylcoumarin in a 60:20:20 mol % Ratio:

4.50 g of styrene sulfonic acid sodium salt, 0.7 g of methacrylic acid, and 2.33 g of 7-(2-methacryloyloxyethoxy)-4-methylcoumarin were weighed out into a 250 ml single neck round-bottom flask dissolved in a solvent mixture of 11 g water, 11 g of dimethylacetamide (DMA), and 11 g of isopropyl alcohol. 0.08 g of 2,2'-azodi(2-methylbutyronitrile) AMBN initiator was added and nitrogen was bubbled through the slurry for 60 minutes before heating in an oil bath at 65° C. for about 18 hours. The reaction solution was cooled and a precipitated formed. The reaction mixture was diluted with water to form a clear solution that was dialyzed for about 18 hours and then concentrated to a 14.06 weight % solids solution that was suitable for application to a substrate. The weight average molecular weight ($M_w$) of the resulting water-soluble reactive polymer was 225,000 as determined by size exclusion chromatography (SEC).

Preparation of Inventive Water-soluble Reactive Polymer D from 3-Sulfopropyl Methacrylate Potassium Salt, Methacrylic Acid, and 2-Cinnamoyl-ethyl Methacrylate in a 70:10:20 mol % Ratio:

In a 100 ml single neck round bottom flask 4.13 g of 3-sulfopropyl methacrylate potassium salt, 0.22 g of methacrylic acid, 1.30 g of 2-cinnamoyl-ethyl methacrylate, and 0.058 g of AMBN were dissolved in a solvent mixture consisting of 8.5 g of water, 8.5 g of methyl ethyl ketone (MEK), and 6.32 g of isopropyl alcohol (IPA). The reaction mixture was purged for 30 minutes with nitrogen, capped with a septum, and set into a preheated oil bath at 75° C. overnight. The reaction mixture was then cooled and placed in a dialysis bag with MWCO of 3500 and dialyzed until the bag was fully swollen. The contents were then evaporated to a concentration of 9.76 weight % solids. The weight average molecular weight ($M_w$) of the resulting water-soluble reactive polymer was 250,000 as determined by size exclusion chromatography (SEC).

Preparation of Acidic Aniline Reactive Composition:

An oxidative acidic aniline reactive composition (bath) was prepared as two parts that were combined just before the crosslinked reactive polymer patterns were immersed. Part A consisted of a 500 ml solution that was 0.05 molar aniline and 0.25 molar hydrochloric acid. Part B was a 500 ml solution of 0.05 molar ammonium persulfate. When ready for use, Part B was added to Part A with stirring for 5 minutes before contact with the crosslinked reactive polymer patterns.

INVENTION EXAMPLE 1

Formation of Electrically-Conductive Product Articles from Uniformly Coated Precursor Articles A photocurable composition containing either 10 weight % of water-soluble Polymer A or 9.3 weight % of water-soluble Polymer D and 0.05 weight % of Dow Tergitol™ 15-S-9 surfactant (Dow Chemical) was filtered with a 1 μm syringe filter and spin coated at 1500 RPM onto PET, poly(ethylene terephthalate) film with a polymeric adhesion layer of a copolymer derived from glycidyl methacrylate and butyl acrylate.

The resulting precursor articles were exposed to 350 nm to 450 nm ultraviolet light through a chrome-on-quartz contact mask for 15 seconds (water-soluble reactive Polymer A and 60 seconds (water-soluble reactive Polymer D) then each was heated to 60° C. for 60 seconds. Each of the imagewise exposed and heated articles was then immersed in well agitated distilled water for 2 minutes to remove the water-soluble reactive polymer from the non-crosslinked regions from the PET substrate. All but one of the resulting patterned intermediate articles was then immersed in a 1 molar ferric sulfate solution for 2 minutes, rinsed with water for about 30 seconds, and dried.

Each of the intermediate articles having ferric ions attached to the crosslinked reactive polymer in the crosslinked patterns was then immersed in the acidic aniline reactive composition (bath) that had been stirring for 5 minutes after the two parts were combined as described above. The articles having crosslinked patterns obtained using water-soluble reactive Polymer A that had been immersed in the ferric sulfate solution began turning emerald green at about 3 minutes but were not electrically-conductive at this point. These articles were then removed from the bath, rinsed in distilled water for at least 1 minute, and then dried in air.

The product articles having crosslinked patterns obtained using water-soluble reactive Polymer A patterns that were left in and removed from the acidic aniline reactive composition at times of between 5 minutes and 7 minutes exhibited a deep emerald green color and had electrically-conductive patterns having a resistance of between 100 kohms and 10,000 kohms measured using a simple two-point resistance measurement.

The product article having a pattern obtained using water-soluble reactive Polymer A that had not been immersed in the ferric sulfate solution exhibited a deep emerald green electrically-conductive pattern after 23 minutes in the acidic aniline reactive composition.

The product articles prepared using water-soluble reactive Polymer D that had been immersed in the ferric sulfate solution had electrically-conductive patterns after between 9 minutes and 11 minutes in the acidic aniline reactive composition.

INVENTION EXAMPLE 2

Formation of Electrically-Conductive Product Articles from Ink Jet Printed Precursor Articles Photocurable compositions comprising either 4 weight % of water-soluble reactive Polymer A, B, or C, 10 weight % of ethylene glycol, and 0.5 weight % of Tergitol® 15-S-9 surfactant (Dow Chemical) were prepared and each was filtered with a 1 um disk filter. Each filtered photocurable composition was then loaded as an "ink" into an ink cartridge designed for a consumer inkjet printer with a thermal ink jet print head. Each of these inks was printed onto a PET substrate that has been pre-coated as described for Invention Example 1 to form a pattern of the photocurable composition in a precursor article. Each pattern in the precursor articles was composed of interleaved 0.5 mm lines connected to a probe pad. Each precursor article was allowed to air dry and then exposed to 350 nm to 450 nm ultraviolet light for 120 seconds to thoroughly crosslink the patterns of water-soluble reactive polymers in the ink jet printed photocurable composition.

Each exposed intermediate article was then immersed in the 1 molar ferric sulfate solution (described above) for 2 minutes, rinsed in distilled water for about 1 minute, and then dried. The intermediate articles having ferric ions in the crosslinked water-soluble reactive polymer patterns were then immersed in the acidic aniline reactive composition described above. Each crosslinked pattern began turning green after about 3 minutes. Product articles that were removed from the acidic aniline reactive composition after between 5 minutes and 7 minutes, rinsed with water, and dried, were emerald green and had electrically-conductive patterns.

The invention has been described in detail with particular reference to certain preferred embodiments thereof, but it will be understood that variations and modifications can be effected within the spirit and scope of the invention.

The invention claimed is:

1. A method for providing an electrically-conductive polyaniline pattern, the method comprising:
providing a uniform layer of a photocurable composition on a supporting side of a substrate, the photocurable composition comprising a water-soluble reactive polymer comprising (a) greater than 40 mol % of recurring units comprising sulfonic acid or sulfonate groups, (b) at least 5 mol % of recurring units comprising a pendant group capable of crosslinking via [2+2] photocycloaddition, all amounts based on the total recurring units in the water-soluble reactive polymer;
exposing the photocurable composition to radiation sufficient to cause crosslinking via [2+2] photocycloaddition of the (b) recurring units, thereby forming a crosslinked polymer on the supporting side of the substrate; and
contacting the crosslinked polymer with an aniline reactive composition comprising an aniline monomer and up to 0.5 molar of an aniline oxidizing agent, in a molar ratio of from 1:0.5 to 1:1.5 of the aniline monomer to the aniline oxidizing agent, thereby forming an electrically-conductive polyaniline disposed either within, on top of, or both within and on top of, the crosslinked polymer.

2. The method of claim 1, comprising:
exposing the uniform layer of the photocurable composition in an imagewise fashion, thereby forming a pattern of crosslinked regions comprising crosslinked polymer and non-crosslinked regions comprising non-crosslinked, water-soluble reactive polymer on the supporting side of the substrate,
removing the non-crosslinked, water-soluble reactive polymer from the supporting side of the substrate, and
contacting the crosslinked polymer with the aniline reactive composition, thereby forming a pattern of the electrically-conductive polyaniline disposed either within, on top of, or both within and on top of, the crosslinked polymer.

3. The method of claim 1, wherein the aniline reactive composition comprises a persulfate as the aniline oxidizing agent.

4. The method of claim 1, wherein the aniline reactive composition is acidic.

5. The method of claim 1, further comprising:
between removing any non-crosslinked water-soluble reactive polymer from the supporting side of the substrate and contacting the crosslinked polymer with the aniline reactive composition, contacting the crosslinked polymer with a solution of at least 0.1 molar ferric ions as an aniline oxidation agent.

6. The method of claim 1, wherein the exposing is carried out using electromagnetic radiation having a wavelength of at least 200 nm and up to and including 450 nm.

7. The method of claim 1, wherein the water-soluble reactive polymer comprises at least 50 mol % and up to and including 80 mol % of the (a) recurring units comprising sulfonic acid or sulfonate groups, based on the total recurring units in the water-soluble reactive polymer.

8. The method of claim 1, wherein the water-soluble reactive polymer comprises at least 5 mol % and up to and including 30 mol % of the (b) recurring units comprising a pendant group capable of crosslinking via [2+2] photocycloaddition based on the total recurring units in the reactive polymer.

9. The method of claim 1, wherein the reactive polymer further comprises at least 1 mol % and up to and including 65 mol % of (c) recurring units comprising a pendant hydroxyl, amide, or carboxylic acid group, based on the total recurring units in the reactive polymer.

10. The method of claim 1, wherein the (b) recurring units comprising a pendant group capable of crosslinking via [2+2] photocycloaddition comprise:
(i) a photosensitive —C(=O)—CR=CR$^1$—Y group wherein R and R$^1$ are independently hydrogen or an alkyl group having 1 to 7 carbon atoms, a 5- to 6-membered cycloalkyl group, an alkoxy group having 1 to 7 carbon atoms, a phenyl group, or a phenoxy group, and Y is an aryl or heteroaryl group;
(ii) a photosensitive, non-aromatic unsaturated carbocyclic group;
(iii) a photosensitive, aromatic or non-aromatic heterocyclic group comprising a carbon-carbon double bond that is conjugated with an electron withdrawing group;
(iv) a photosensitive non-aromatic unsaturated heterocyclic group comprising one or more amide groups that are conjugated with a carbon-carbon double bond, which photosensitive non-aromatic unsaturated heterocyclic group is linked to the water-soluble backbone at an amide nitrogen atom; or
(v) a photosensitive substituted or unsubstituted 1,2-diarylethylene group.

11. The method of claim 1, wherein the (b) recurring units comprising a pendant group capable of crosslinking via [2+2] photocycloaddition are selected from one or more of the following monomers:
2-cinnamoyl-ethyl methacrylate;
2-cinnamoyl-ethyl acrylate;
2-[3-(3-pyridyl)acryloyl]ethyl methacrylate;
2-cyclopropene-1-carboxylic acid, 2,3-diphenyl-, 2-[(2-methyl-1-oxo-2-propen-1-yl)oxy]ethyl ester;
2-cyclopropene-1-carboxylic acid, 2,3-diphenyl-, 2-[(2-methyl-1-oxo-2-propen-1-yl)amino]ethyl ester;

4-(2,3-diphenyl-2-cyclopropene-1-carbonyloxy)styrene;
4-(2,3-diphenyl-2-cyclopropene-1-carbonylamino)styrene;
4-(2,3-diphenyl-2-cyclopropene-1-carbonyloxy)ethane;
7-(2-methacryloyloxyethoxy)-4-methylcoumarin;
7-(2-methacryloyloxyethoxy)-coumarin;
7-(3-methacryloyloxysulfopropyl)-4-methylcoumarin;
7-(methacryloyloxy)-4-methylcoumarin;
6-(methacryloyloxy)-4-methylcoumarin;
6-(2-methacryloyloxyethoxy)-4-methylcoumarin;
7-(2-methacryloyloxyethoxy)-quinoline-2-one;
7-(2-methacryloyloxyethoxy)-4-methylquinoline-2-one;
5-(2-methacryloyloxyethoxy)-naphthoquinone;
N-(2-methacryloyloxyethyl)-2,3-dimethylmaleimide;
3-(2-(methacryloyloxyethyl)-thymine;
1-methyl-4-[2-(4-(2-methacryloxyethyl)-carbonyloxyphenyl)ethenyl]pyridinium trifluormethylsulfonate;
1-methyl-4-[2-(4-(2-methacryloxyethyl)-carbonyloxyphenyl)ethenyl]quinolinium trifluoromethylsulfonate;
1-methyl-2-[2-(4-(2-methacryloxyethyl)-carbonyloxyphenyl)ethenyl]thiazolium trifluoromethylsulfonate;
4-[2-(4-(2-methacryloxyethyl)-carbonyloxyphenyl)ethenyl]pyridine; and
1-phenyl-2-[(4-(2-methacryloxyethyl)-carbonyloxyphenyl)]ethylene.

12. The method claim 1, wherein the substrate is a continuous polymeric web having an integrated transmittance of at least 90%.

13. The method of claim 1, wherein the photocurable composition further comprises at least 0.1 weight % of a photosensitizer.

14. The method of claim 1, further comprising:
providing a uniform layer of the same or different photocurable composition on an opposing supporting side of the substrate
exposing the same or different photocurable composition on the opposing supporting side of the substrate to radiation sufficient to cause crosslinking via [2+2] photocycloaddition of the (b) recurring units, thereby forming a crosslinked polymer on the opposing supporting side of the substrate; and
contacting the crosslinked polymer on the opposing supporting side of the substrate with an aniline reactive composition comprising an aniline monomer and up to 0.5 molar of an aniline oxidizing agent, in a molar ratio of from 1:0.5 to 1:1.5 of the aniline monomer to the aniline oxidizing agent, thereby forming an electrically-conductive polyaniline disposed either within, on top of, or both within and on top of, the crosslinked polymer on the opposing supporting side of the substrate.

15. The method of claim 14, wherein the substrate is a continuous polymeric web having an integrated transmittance of at least 90%.

16. The method of claim 14, comprising:
exposing the uniform layer of the photocurable composition on the opposing supporting side of the substrate in an imagewise fashion, thereby forming a pattern of crosslinked regions comprising crosslinked polymer and non-crosslinked regions comprising non-crosslinked, water-soluble reactive polymer on the opposing supporting side of the substrate,
removing the non-crosslinked, water-soluble reactive polymer from the opposing supporting side of the substrate to form a pattern of crosslinked polymer on the opposing supporting side of the substrate, and
contacting the pattern of crosslinked polymer on the opposing supporting side of the substrate with the aniline reactive composition, thereby forming a pattern of the electrically-conductive polyaniline disposed either within, on top of, or both within and on top of, the pattern of crosslinked polymer on the opposing supporting side of the substrate.

17. The method of claim 1, wherein the photocurable composition further comprises graphene, carbon nanotubes, graphite, carbon black, or other conductive carbon-containing material in an amount of at least 0.1 weight %, based on the total dry weight of the photocurable composition.

18. The method of claim 1, wherein the photocurable composition further comprises carbon-coated metal particles.

19. The method of claim 1, wherein the photocurable composition further comprises carbon-coated silver particles or carbon-coated copper particles.

20. The method of claim 1, further comprising, between removing any non-crosslinked water-soluble reactive polymer from the supporting side of the substrate and contacting the crosslinked polymer with the aniline reactive composition, contacting the crosslinked polymer with a metal ion catalyst for aniline oxidation, followed by rinsing the crosslinked polymer.

* * * * *